United States Patent
Zuniga et al.

(10) Patent No.: US 8,360,409 B2
(45) Date of Patent: Jan. 29, 2013

(54) APPARATUS AND METHOD FOR SIMULTANEOUS TREATMENT OF MULTIPLE WORKPIECES

(75) Inventors: Steven M. Zuniga, Soquel, CA (US);
Derek G. Aqui, Portland, OR (US);
Andrew J. Nagengast, Sunnyvale, CA (US); Keenan Leon Guerrero, Boise, ID (US); Harish K. Bolla, Sunnyvale, CA (US); Aditya Agarwal, Sunnyvale, CA (US)

(73) Assignee: GTAT Corporation, Nashua, NH (US)

( * ) Notice: Subject to any disclaimer, the term of this patent is extended or adjusted under 35 U.S.C. 154(b) by 650 days.

(21) Appl. No.: 12/636,328

(22) Filed: Dec. 11, 2009

(65) Prior Publication Data
US 2011/0140334 A1    Jun. 16, 2011

(51) Int. Cl.
*B23Q 3/00*    (2006.01)
(52) U.S. Cl. ............ 269/289 R; 269/290; 269/292
(58) Field of Classification Search ............ 269/289 R, 269/290, 292
See application file for complete search history.

(56) References Cited

U.S. PATENT DOCUMENTS

| | | | |
|---|---|---|---|
| 4,039,643 | A | 8/1977 | Dean et al. |
| 4,457,661 | A | 7/1984 | Flint |
| 5,855,465 | A | 1/1999 | Boitnott |
| 6,287,386 | B1 | 9/2001 | Perlov |
| 6,651,867 | B2 | 11/2003 | Angel |
| 6,802,935 | B2 | 10/2004 | Cheng et al. |
| 7,557,904 | B2 | 7/2009 | Ohmiya et al. |
| 7,737,035 | B1 * | 6/2010 | Lind et al. .......... 438/680 |
| 2002/0154975 | A1 | 10/2002 | Perlov et al. |
| 2004/0197174 | A1 | 10/2004 | Van Den Berg |
| 2008/0085174 | A1 | 4/2008 | Rebstock |

\* cited by examiner

*Primary Examiner* — Lee D Wilson
*Assistant Examiner* — Shantese McDonald
(74) *Attorney, Agent, or Firm* — The Mueller Law Office, P.C.

(57) ABSTRACT

A system for simultaneously treating multiple workpieces is configured with sites, configured to hold respective workpieces, affixed on a rotatable base. Each site has a shelf accommodating an interior space and may be positioned by base rotation in alignment with a station of fixed location. Each station is equipped with an active component. The active components are movable simultaneously within respective stations into the respective interior spaces of respective aligned sites.

22 Claims, 32 Drawing Sheets

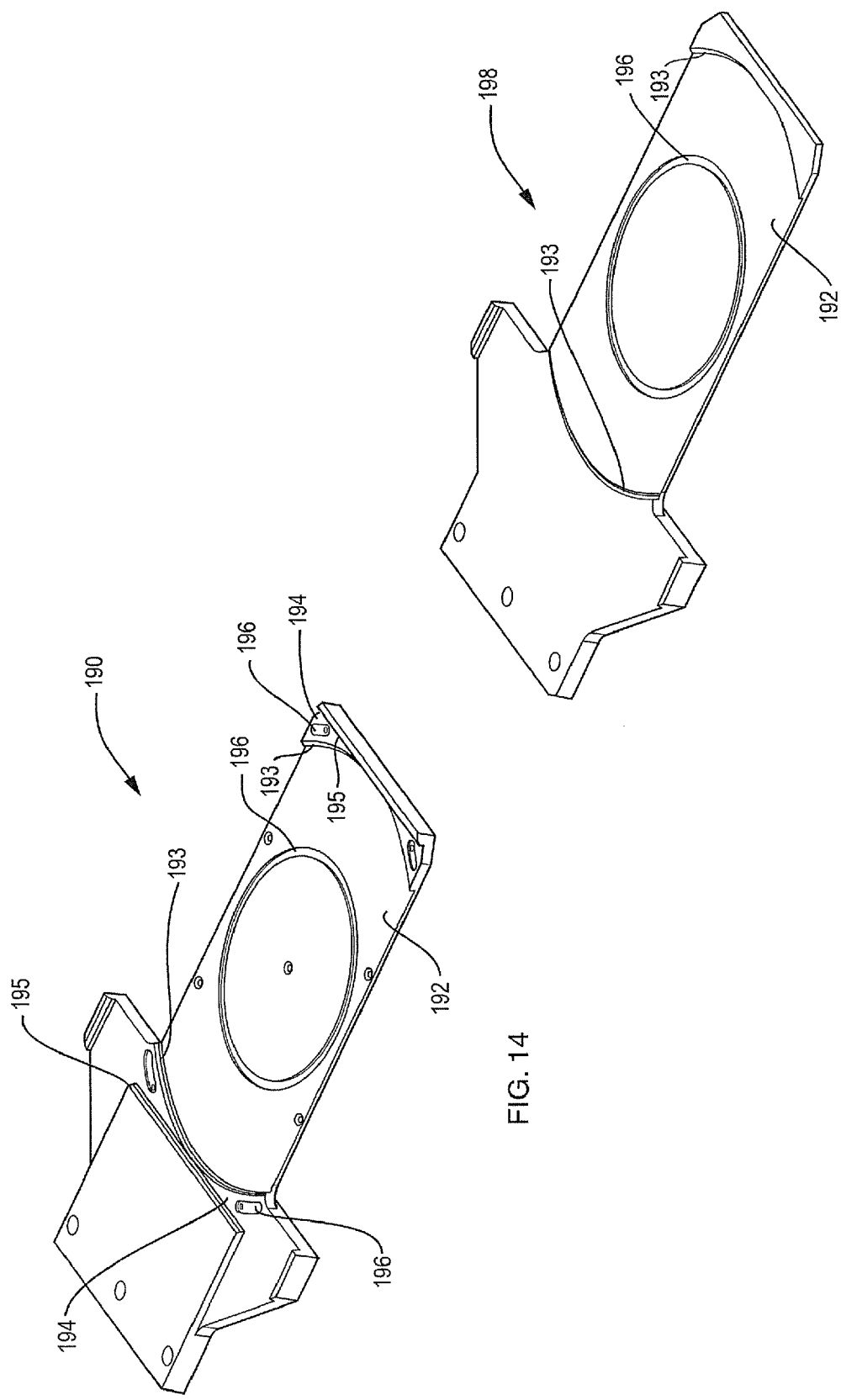

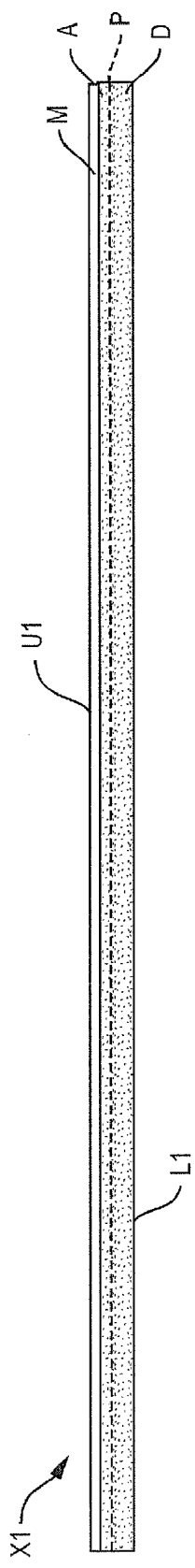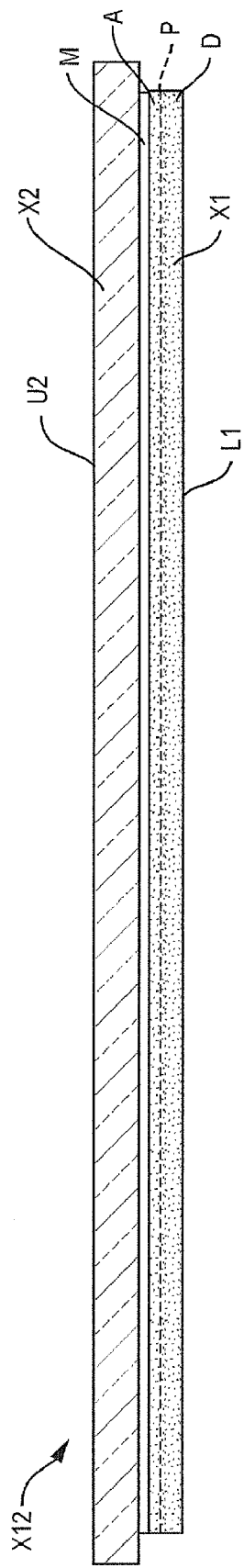

APPARATUS AND METHOD FOR SIMULTANEOUS TREATMENT OF MULTIPLE WORKPIECES

RELATED APPLICATIONS

This application is related to Zuniga et al., U.S. patent application Ser. No. 12/636,410, "Two-Chamber System and Method for Serial Bonding and Exfoliation of Multiple Workpieces," and Zuniga et al., U.S. patent application Ser. No. 12/636,490, "Apparatus and Method for Simultaneous Treatment of Multiple Workpieces," each filed on even date herewith, owned by the assignee of the present application, and hereby incorporated by reference.

BACKGROUND OF THE INVENTION

1. Field of the Invention

This invention relates to systems for treating workpieces at multiple sites simultaneously. In particular this invention relates to apparatus and methods for bonding and/or exfoliating a plurality of workpieces.

2. Background Information

A layered assembly incorporating a semiconductor wafer is a structure useful for forming devices such as transistors, displays, photovoltaic devices, and microelectromechanical systems. A basic step of manufacturing the layered assembly includes bonding a semiconductor wafer to a substrate by, for example, thermocompression, fusion, or anodic bonding.

In one approach, structures comprising a thin silicon lamina bonded to a substrate have been made by first implanting a silicon wafer with concentrated atoms defining a cleave plane. The implanted wafer is then bonded to a substrate. Upon annealing, a lamina, bonded to the substrate exfoliates from the wafer at the cleave plane. The usefulness of the product layered assemblies notwithstanding, they are cost-prohibitive for some applications.

There is, accordingly, a need for a more cost-effective way to form bonded layered assemblies.

SUMMARY OF THE INVENTION

A system for simultaneously treating a plurality of workpieces comprises a structure within which are defined a plurality of substantially identical stations. The stations comprise one or more loading stations and one or more unloading stations. The loading and unloading stations are mutually distinct and each of the stations is configured with an active component. A base disposed above the lower components has thereon a plurality of substantially identical sites which may be fixed in place. The sites are arranged analogously to the stations. Each site is configured to bear one of the workpieces and comprises a shelf, having a horizontal ledge and a vertical wall, accommodating an interior space above the base. The base is rotatable about an axis to align each of the sites in turn with respective stations for loading and unloading. In the stations the respective active components are operable to rise into the respective interior spaces of respective aligned sites.

BRIEF DESCRIPTION OF THE DRAWINGS

The invention description below refers to the accompanying drawings, wherein identical reference symbols designate like structural or functional elements, and in which:

FIG. 14 shows a two-contact end effector;

FIG. 15 shows a single-grip end effector;

FIG. 26 is a sectional view of a semiconductor wafer implanted with ions to create a cleave plane defining a lamina portion and a donor portion;

FIG. 27 is a sectional view of an ion-implanted semiconductor wafer bonded to a receiver body in accordance with the invention;

Features in the figures are not, in general, drawn to scale.

DETAILED DESCRIPTION OF AN ILLUSTRATIVE EMBODIMENT

Figure 1:
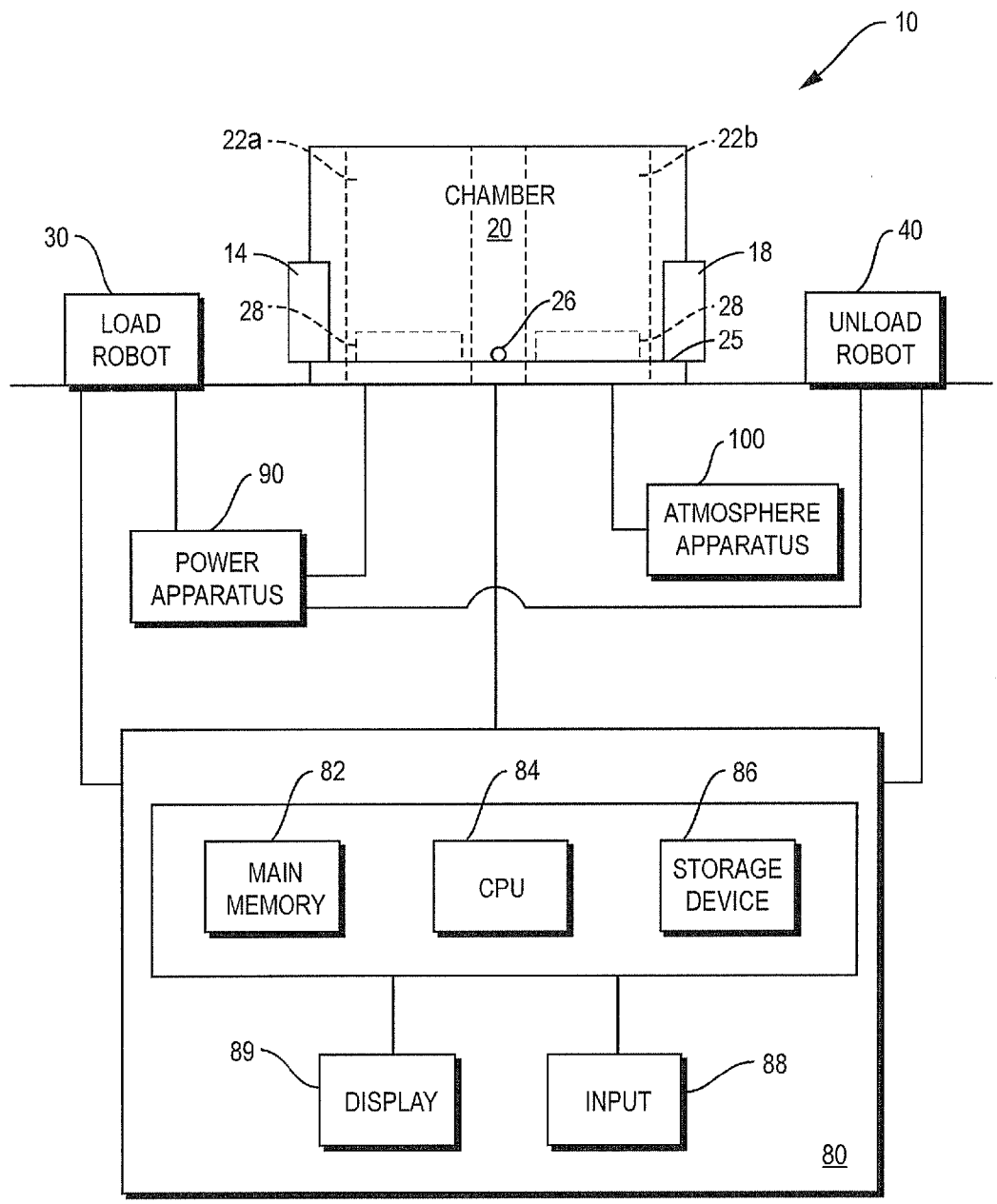
FIG. 1 is a block diagram of a materials processing system compatible with the invention.

With reference to FIG. 1, in an illustrative embodiment, a materials processing system 10 for simultaneously treating several workpieces comprises a structure 20 having an interior accessible by a load robot 30 through an input gate 14 and by an unload robot 40 through an output gate 18.

A power apparatus 90 is operatively coupled to the input and output gates 14 and 18 and to components of the structure 20 that, e.g., move, generate heat or assume a desired electrical potential. Such components are discussed below with reference to FIG. 5. The power apparatus 90 may incorporate, for example, electrical, electromechanical, pneumatic or hydraulic elements, known to those skilled in the art.

An atmosphere apparatus 100 is configured to regulate the atmosphere in the structure 20. Vacuum or pressure sensors (not shown) may be disposed in the structure 20 and connected to provide feedback regulating operation of the atmosphere apparatus 100. The atmosphere apparatus 100 may, e.g., alternately admit constituents, such as inert gas or air, or remove constituents from the structure 20 to maintain desired conditions. Applicable practices for managing the environment in the structure 20 are known to those skilled in the art.

A computer system 80 is programmable and includes a main memory 82, a central processing unit (CPU) 84, and a storage device 86, operatively coupled to an input device 88 and a display 89. A graphical user interface, software programs, and experimental parameters may be stored in the main memory 82. The computer system 80 is configured to cooperate with the power apparatus 90, the atmosphere apparatus 100, components of the structure 20 described herein, and sensors (not shown) of, e.g., stress and temperature to generate treatment conditions in the structure 20. The treatment conditions may encompass, e.g., temperatures in the structure 20, pressure applied to workpieces, atmosphere composition, bias voltages, and positions of movable components, which may be predetermined by a user and relayed through the computer 80.

The structure 20 is configured with a plurality of stations 22a and 22b, functioning as treatment or process stations, each having a fixed location in the structure 20 and configured for acting on a workpiece. The substantially identical stations 22a and 22b include equal numbers of mutually distinct loading and unloading stations. One or more loading stations 22a for receiving a workpiece for treatment are accessible by the load robot 30 through the input gate 14. One or more unloading stations 22b for removing a workpiece after treatment are accessible by the output shuttle 40 through the output gate 18. Each of the stations 22a and 22b is fitted with one or more active components, described below, for acting on a workpiece, for example by heating or exerting pressure on it. The active components are operatively coupled to the power apparatus 90, movable within their respective stations 22a and 22b, and operable simultaneously in all of the stations 22a and 22b.

The structure 20 is further configured with a base 25, functioning as a treatment or process base, rotatable about a pivot point 26 to pass through the stations 22a and 22b. The active components of the stations 22a and 22b may be disposed above and/or below the base 25. Fixed on the base 25 are a plurality of substantially identical sites 28 functioning as treatment or process sites, each configured to bear a workpiece to be acted on by an active component of one of the stations 22a and 22b. The base 25 is rotatable to align each of the sites 28 in turn with a loading station 22a and an unloading station 22b.

The sites 28 are arranged on the base 25 analogously to the stations 22a and 22b, defined herein to mean that for some orientations of the base 25, when one of the sites 28 is aligned with one of the stations 22a and 22b, all of the sites 28 have the identical spatial relationship to respective stations 22a and 22b and their respective active components. The base 25 is thus rotatable to align all of the sites 28 with respective stations 22a and 22b simultaneously. A resulting position, in which all of the sites 28 are aligned with respective stations 22a and 22b is referred to herein as an operating orientation of the base 25.

A two-site embodiment of the structure may be configured with one loading station 22a and one unloading station 22b. In alternative arrangements the structure 20 may be equipped with two nonoverlapping pairs of sites 28 to treat workpieces in two loading stations 22a and two unloading stations 22b or, e.g., with four nonoverlapping pairs of sites 28 and two loading stations 22a, two unloading stations 22b, and four stations inaccessible from either of the input and output gates 14 and 18.

Figure 2:
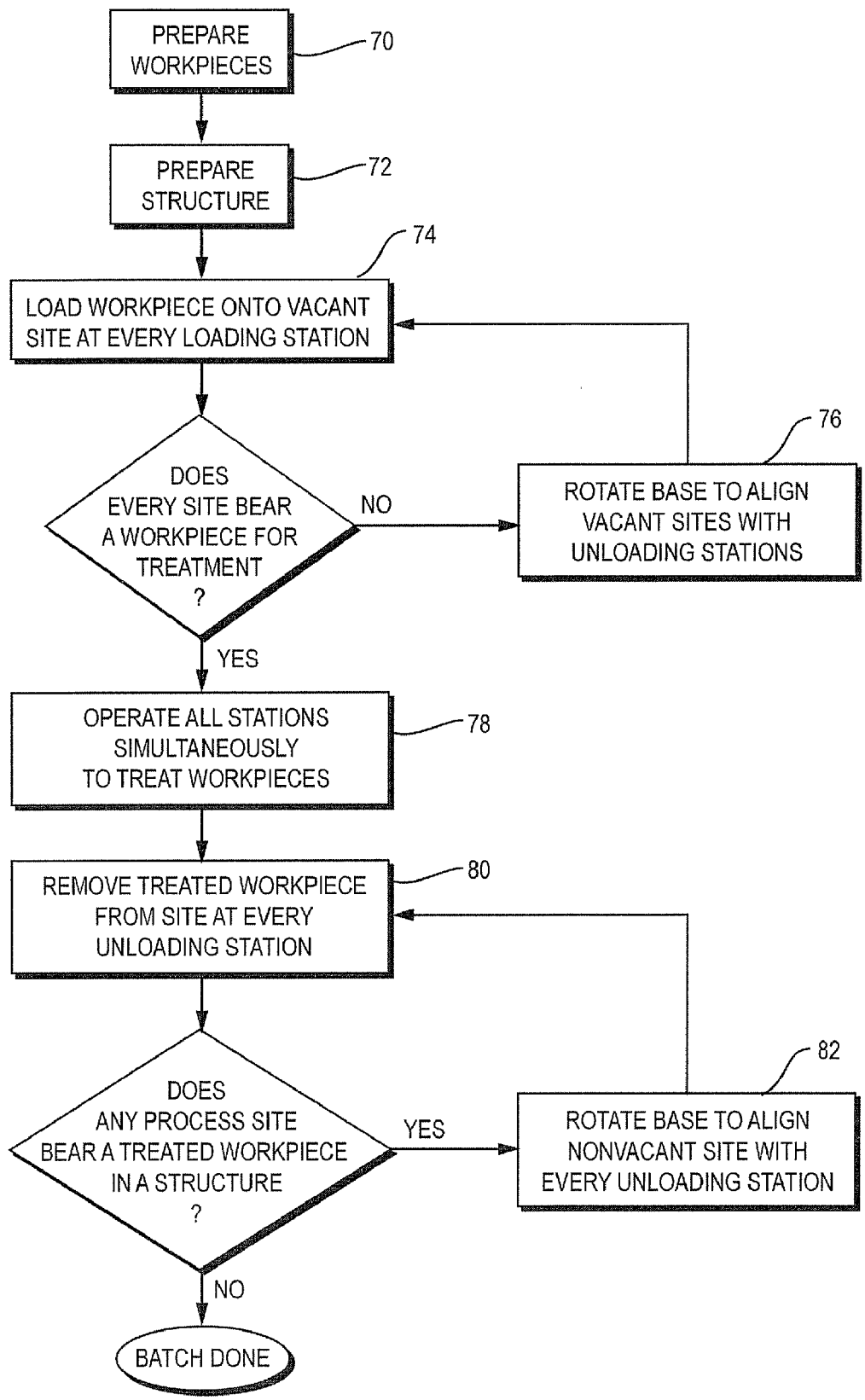
FIG. 2 is a flow diagram of an illustrative sequence, compatible with the invention, for treating multiple workpieces simultaneously in the system shown in FIG. 1.

FIG. 2 demonstrates steps in an exemplary process sequence for treatment of a batch of workpieces by the materials processing system 10 in the structure 20. With continuing reference to FIGS. 1 and 2, the workpieces are prepared for treatment in the structure 20 (step 70). The workpieces are dimensioned to fit on the respective sites 28 in a manner compatible with the operation to be performed on the workpieces in the structure 20. Other aspects of workpiece preparation may depend on the intended end use of the treated workpieces.

Beginning with the sites 28 all vacant, unencumbered from receiving workpieces, the computer system 80 is operated to prepare the structure 20 for use (step 72). Preparation may include, e.g., positioning the load and unload robots 30 and 40 outside the structure 20; orienting the base 25 in an operating orientation, the sites 28 aligned with respective stations 22a and 22b; and putting the active components of the stations 22a and 22b into respective rest positions, e.g., out of the way of the load robot 30. The computer system 80 may be furthermore operated to close the input and output gates 14 and 18, bring the stations 22a and 22b to a preliminary temperature and evacuate the structure 20 or fill it with a desired preliminary gaseous environment.

The load robot 30 is operated to carry a workpiece for treatment through the input gate 14 and onto a site 28 in each loading station 22a of the prepared structure 20 (step 74). If the structure 20 comprises more than one loading station 22a, the load robot 30 may be operable to load a workpiece onto each of the sites 28 aligned for loading simultaneously or sequentially. The base 25 is prepared for further loading by rotation around the pivot point 26 to the next operating orientation in which a site 28 that is vacant is aligned with each loading station 22a (step 76). The load robot 30 is again operated to load a workpiece for treatment onto a site 28 in each loading station 22a (step 74). The sequence of step 76 and step 74 is then repeated if necessary until none of the sites 28 is vacant, all sites 28 bearing respective workpieces for treatment.

At the end of the loading/rotation loop, all of the sites 28 on the base 25 bear respective workpieces and the base 25 is in an operating orientation. Then, the base 25 remains at rest while all of the stations 22a and 22b are operated simultaneously to treat the loaded workpiece batch (step 78). Operating the stations 22a and 22b entails repositioning their respective active components to apply, e.g., heat, voltage, pressure or a combination thereof to respective workpieces on the respective aligned sites 28.

After treatment, the output gate 18 is opened to permit removal of the treated workpieces from the structure 20. First, the unload robot 40 is operated to remove a treated workpiece from a site 28 aligned with each unloading station 22b and through the output gate 18 (step 80). If the structure 20 comprises more than one unloading station 22b, the output shuttle 40 may be operable to remove a workpiece from each of the sites 28 aligned for unloading simultaneously or sequentially. The base 25 is prepared for further unloading by rotating around the pivot point 26 to the next operating orientation for which each unloading station 22b has a site 28 bearing a treated workpiece aligned therewith (step 82). The output shuttle 40 is again operated to unload a treated workpiece from a site 28 in each unloading station (step 80). The sequence of step 82 and step 80 is then repeated if necessary until none of the sites 28 bears a workpiece treated by operation of the stations 22a and 22b in the structure 20.

When an iteration of step 82 brings a site 28 that is vacant into alignment with each of the loading stations 22a, thereby also accomplishing step 76, the loading loop may be then initiated, by performing step 74, for a subsequent batch. The opposing locations of gates 14 and 18 and the dedicated respective robots 30 and 40 permit concurrent loading and unloading of the base 25, facilitating high throughput of the system 10.

Figure 3:
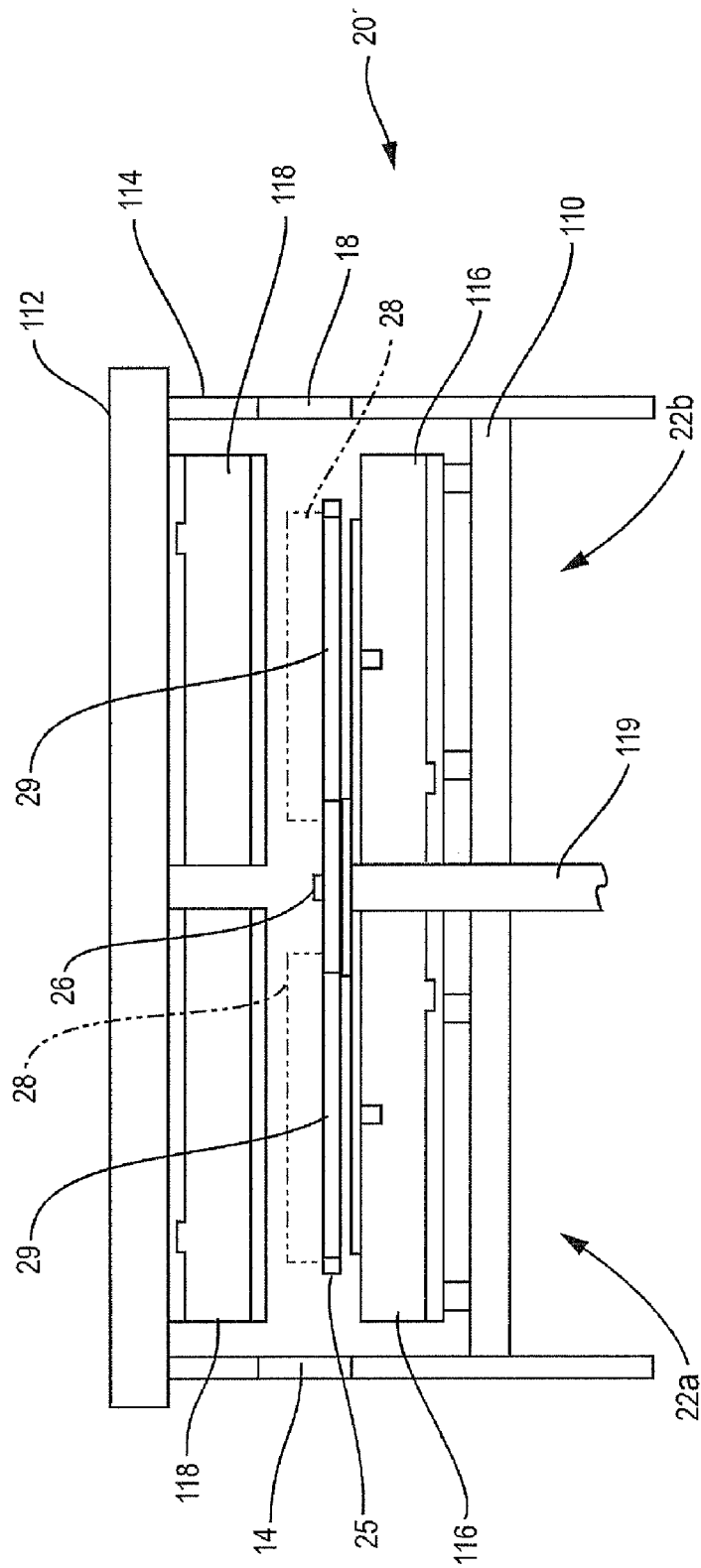
FIG. 3 is a simplified sectional view of a multi-site bonding chamber compatible with the invention, taken through the center of the chamber from its input gate to its output gate.

In one embodiment, the structure 20 is a bonding chamber operable to form four bonded structures simultaneously from four respective two-body workpieces. FIG. 3 shows an exemplary bonding chamber 20' with active components in respective rest positions and the base 25 in an operating orientation. The illustrative bonding chamber 20' is defined by a chamber floor 110, a chamber lid 112, and an outer wall 114 constituting a vacuum enclosure. The floor 110, lid 112 and outer wall 114 are illustratively of aluminum or stainless steel.

Each of the stations 22a and 22b, which serve as bonding stations in the chamber 20', comprises a lower component assembly 116 and an upper component assembly 118. The chamber floor 110 supports the lower component assemblies 116. The chamber lid 112 bears the upper component assemblies 118. The base 25, which serves as bonding base in the bonding chamber 20', is affixed to a rotatable cylindrical shaft 119, which holds the base 25 interposed between the lower component assemblies 116 and the upper component assemblies 118. Two loading stations 22a and two unloading stations 22b constitute all of the stations in the bonding chamber 20'.

Figure 4:
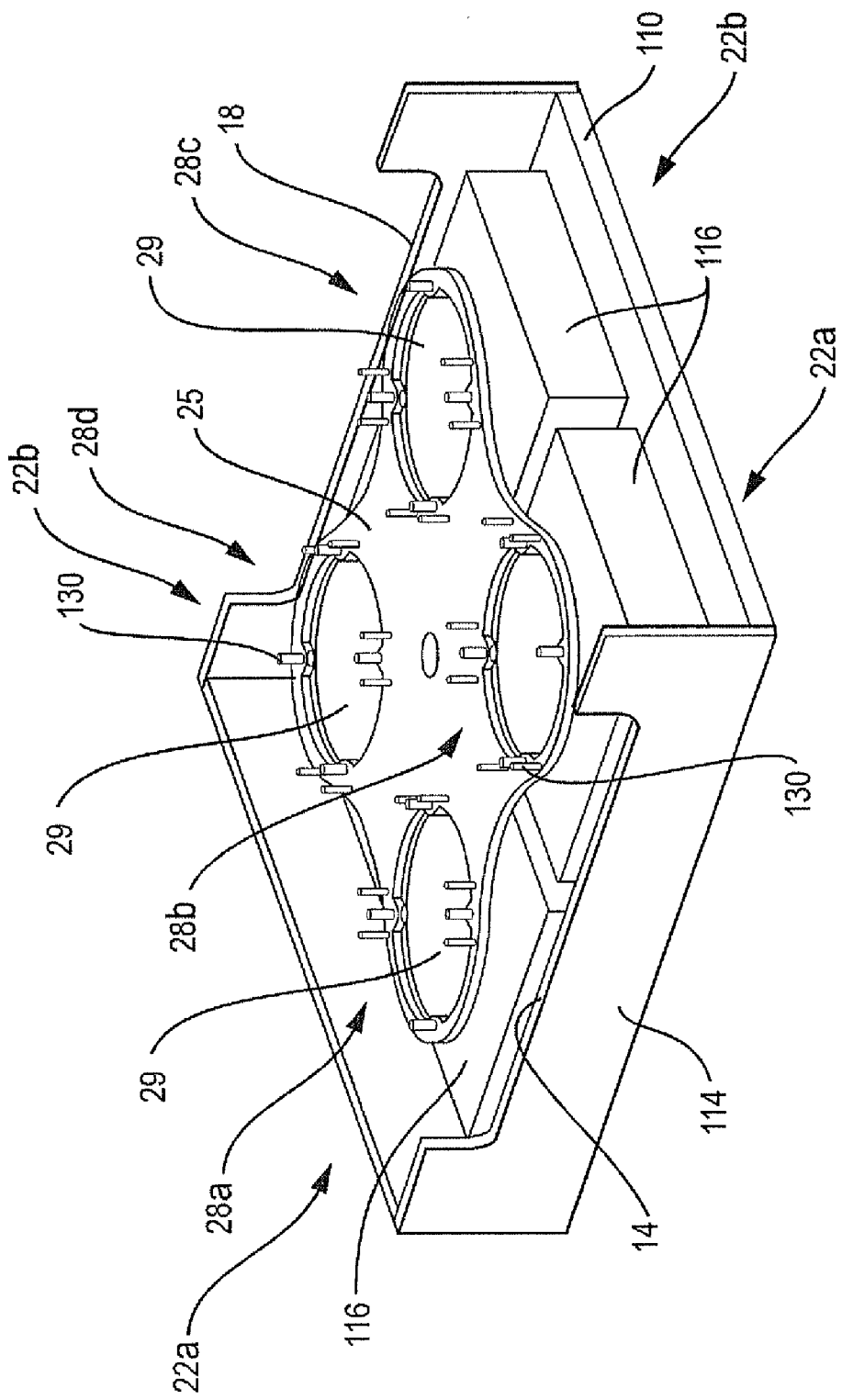
FIG. 4 is a perspective view of the bonding chamber, shown in FIG. 3, with the enclosure partially removed.

With reference to FIG. 4, four identical sites 28, which serve as bonding sites in the bonding chamber 20', are fixed on the base 25. For clarity in discussing an illustrative treatment sequence below, each of the four sites 28 on the base 25 is individually designated 28a, 28b, 28c or 28d. The sites 28 are defined by respective sets of workpiece supports 130 fixed on the base 25 around respective apertures 29 therein. The illustrative workpiece supports 130 are configured to support respective workpieces above respective apertures 29, as described below with reference to FIG. 6.

Figure 5:
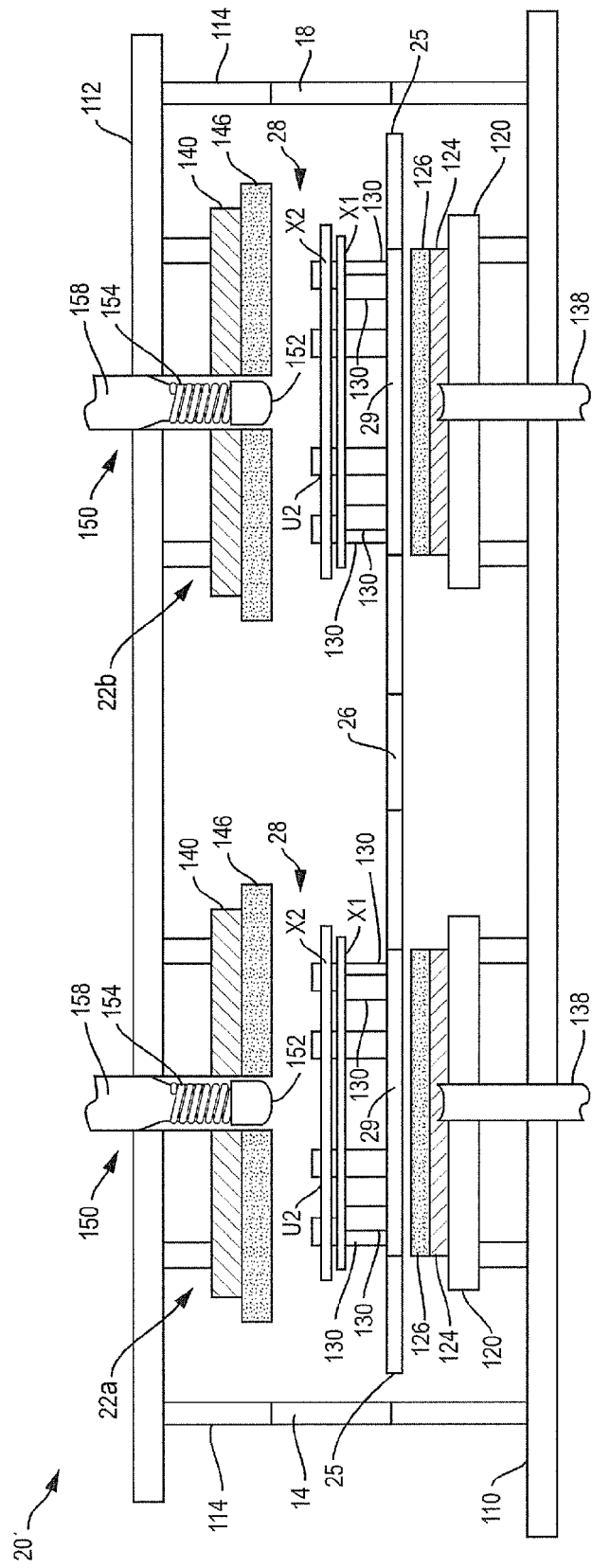
FIG. 5 is an elevational sectional view of the bonding chamber, shown in FIG. 3, taken through an unloading station and a loading station from its input gate to its output gate.

With reference to FIG. 5, the workpiece supports 130 at each of the sites 28 are configured to hold a first body X1 and a second body X2, together constituting a workpiece for bonding, spaced apart and parallel. Each of the lower assemblies 116 (FIG. 3) comprises a lower heater 120 underlying a lower susceptor 126 which functions as the active component of its station 22a or 22b. The lower susceptors 126 are contoured in correspondence to respective apertures 29 such that when one of the sites 28 is aligned with one of the stations 22a and 22b, its lower susceptor 126 is able to pass through the aligned aperture 29. A gimbal plate 124 rests above the lower heater 120 and supports the lower susceptor 126. Each of the upper assemblies 118 (FIG. 3) includes an upper heater 140 and an upper susceptor 146. Illustratively, electrically insulating material (not shown) separates the upper heater 140 and upper susceptor 146.

The lower heater 120 and the upper heater 140 in each of the stations 22a and 22b are coupled to the computer system 80 (FIG. 1) and operable simultaneously to generate electromagnetic radiation, thereby generating heat in and altering or maintaining respective temperatures of the corresponding lower susceptor 126 and the corresponding upper susceptor 146, in accordance with a predetermined process trajectory. The paired lower and upper susceptors 126 and 146 are configured to function as heat-transfer bodies transferring heat to a workpiece borne by a site 28 aligned with one of the stations 22a and 22b during a bonding operation in the bonding chamber 20'.

The base 25 and the workpiece supports 130 are each illustratively of stainless steel or quartz. Quartz may be preferable because of its dimensional stability over a wide temperature range. The susceptors 126 and 146 may be of a thermally conductive material such as, e.g., graphite, silicon carbide, molybdenum, stainless steel, niobium, or aluminum. The heaters 120 and 140 may be constructed from resistive heating elements, for example embedded in a thermally conductive block. Candidate materials and structures appropriate for the heaters 120 and 140 and susceptors 126 and 146 are known to those skilled in the art.

The power apparatus 90 (FIG. 1) may be capable of delivering, e.g., on the order of 2,000 watts or more to each of the heaters 120 and 140 in order to provide for relatively rapid achievement of desired processing temperatures of the respective susceptors 126 and 146. The power apparatus 90 may also be connected with each of the lower and upper susceptors 126 and 146 to allow electrical biasing of the lower susceptors 126 with respect to respective upper susceptors 146 in each of the stations 22a and 22b during treatment.

The chamber floor 110 is illustratively apertured to accommodate a susceptor lift assembly 138, at each of the stations 22a and 22b, and the shaft 119 (FIG. 3). The shaft 119 and the lift assemblies 138 are coupled to the computer system 80 (FIG. 1). In each station the susceptor lift assembly 138 is configured to engage a recess in the gimbal plate 124 and operable to reversibly lift the gimbal plate 124 and the lower susceptor 126 through an aperture 29 in the base 25 resting in an operating orientation. As is known to those of skill in the art, a sealing mechanism (not shown) below the chamber floor 110, e.g., bellows, around each of the susceptor lift assemblies 138 and the shaft 119 may allow movement of components through the floor 110 without compromising the atmosphere in the enclosure of the bonding chamber 20'.

In the embodiment, at each station 22a or 22b, the susceptor lift assembly 138 has vertical range sufficient to move its lower susceptor 126 up to meet the first body X1 on an aligned site 28 and continue upward until the second body X2 is held against the upper susceptor 146, sandwiched with the first body X1 between the two susceptors 126 and 146. Each of the susceptor lift assemblies 138 is furthermore configured to press the lower susceptor 126 in opposition to the upper susceptor 146, thereby applying a bonding pressure at the interface between the first body X1 and the second body X2, as predetermined by the user and communicated through the computer system 80. The bonding pressure may be effected by applying a stress of, for example, several hundreds or thousands of Pascals, for example 500, 1,000, 5,000 or 8,000 Pascals or greater. The susceptor lift assembly 138 is not limited by the type of apparatus used to apply the bonding pressure and may incorporate, for example, electromechanical, pneumatic or hydraulic elements, known to those skilled in the art.

The gimbal plate 124 of each station 22a or 22b is configured to reorient the lower susceptor 126 to conform to the lower surface of the first body X1 when the lower susceptor 126 is pressing the first body X1 and second bodies X2 in opposition to the upper susceptor 146. In this way the gimbal plate 124 affords passive compensation of the orientation of the lower susceptor 126 for deviations from level of the upper susceptor 146 and imperfect planarization of either or both of the bodies X1 and X2. The gimbal plate 124 may be configured so that its gimbal point coincides with the center of the top surface of the first body X1 resting on the support pins 130a. In an alternative embodiment, the functions of the gimbal plate 124 and the lower susceptor 126 may be combined in a single element.

The chamber lid 112 of the bonding chamber 20', each of the upper heaters 140 and each of the upper susceptors 146 are apertured to accommodate a plunger 150 in each of the stations 22a and 22b. Each plunger 150 comprises a plunger tip 152 engaged with a spring 154. The plunger tip 152 is illustratively of silicon carbide or stainless steel. A plunger drive 158, communicating with the computer system 80 (FIG. 1), is operatively coupled to the spring 154 to reversibly lower the plunger tip 152 downward to touch the second body X2. As is known to those of skill in the art, a sealing mechanism (not shown) above the chamber lid 112, e.g., bellows, around the plunger 150 may allow movement of the plunger 150 through the lid 112 without compromising the atmosphere in the bonding chamber 20'.

The plunger drive 158 is illustratively configured to apply a specified force to, or to effect a specified deformation in, the second body X2 in accordance with predetermined parameters. The deformation may be, for example, about 0.1 mm, 0.5 mm or up to about 1 mm. The power apparatus 90 (FIG. 1) is optionally configured to apply a bias, illustratively between 200 and 2,000 volts, between the lower susceptor 126 and the plunger 150 at each of the stations 22a and 22b.

Figure 6:
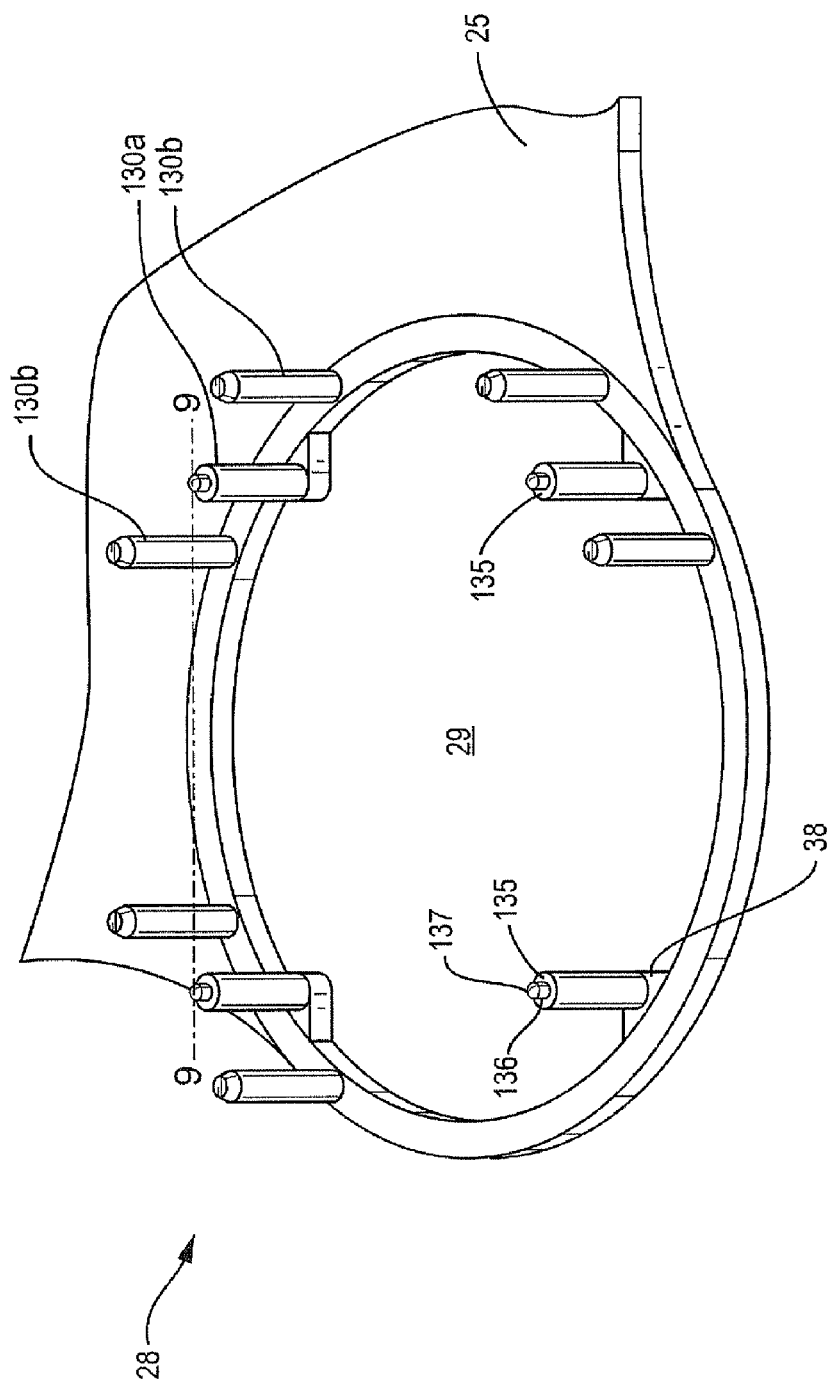
FIG. 6 is a perspective view of a site on the base of the bonding chamber shown in FIG. 3.

For clarity of illustration, FIG. 6 shows an illustrative arrangement of the workpiece supports 130 (FIG. 4), implemented as support pins 130a and capture pins 130b, at one of the sites 28. The workpiece supports 130 may be, for example, of metal such as stainless steel or titanium. The four identical support pins 130a are adapted to hold a circular first body X1. Three pairs of identical capture pins 130b are each positioned to constrain a corner of a second, square body X2 having side length greater than the diameter of the circular first body X1. The support pins 130a and the capture pins 130b are configured conjunctionally to hold the circular first body X1 and the square second body X2 vertically spaced apart at each of the sites 28. In the embodiment, the first body X1 and the second body X2 are planar. As used herein, "planar" and similar phrases used to describe a body refer to a body having a thickness on the order of about 5% or less of a length characterizing its lateral extent. The small respective footprints of the support pins 130a and the capture pins 130b improve their workability with the base 25 over varying temperature in the case that the base 25 is of a material of differing thermal expansion coefficient, such as quartz. Other arrangements for supporting a two-body workpiece on a bonding site are described in co-owned U.S. application Ser. No. 12/495, 114, Zuniga et al., entitled "Bonding Apparatus and Method," the disclosure of which is incorporated herein by reference in its entirety.

In the embodiment, the apertures 29 are generally circular, corresponding in footprint to the first body X1. At each site 28, four extensions 38 of the base 25 into the aperture 29 are located around the aperture 29 at 90-degree intervals. The proximal end of one of the support pins 130a is affixed to the base 25 on each extension 38, for example by screwing into the base 25. To better accommodate differences in thermal expansion between the base 25 and the workpiece supports 130a and 130b, the proximal ends of the respective supports 130 may each be fabricated with one or more longitudinal slots.

Figure 7:
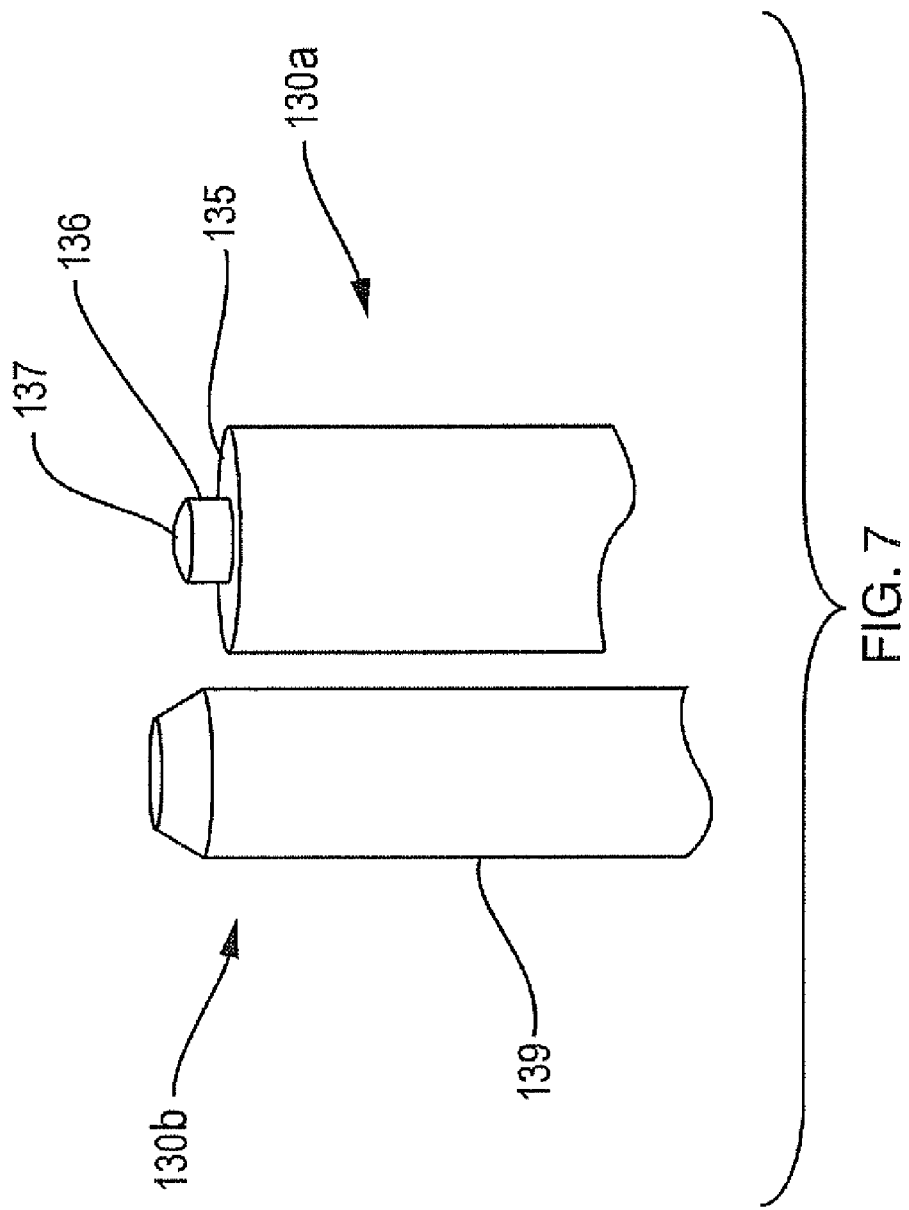
FIG. 7 is a perspective view of a support pin and a capture pin at the site shown in FIG. 6.
Figure 8:
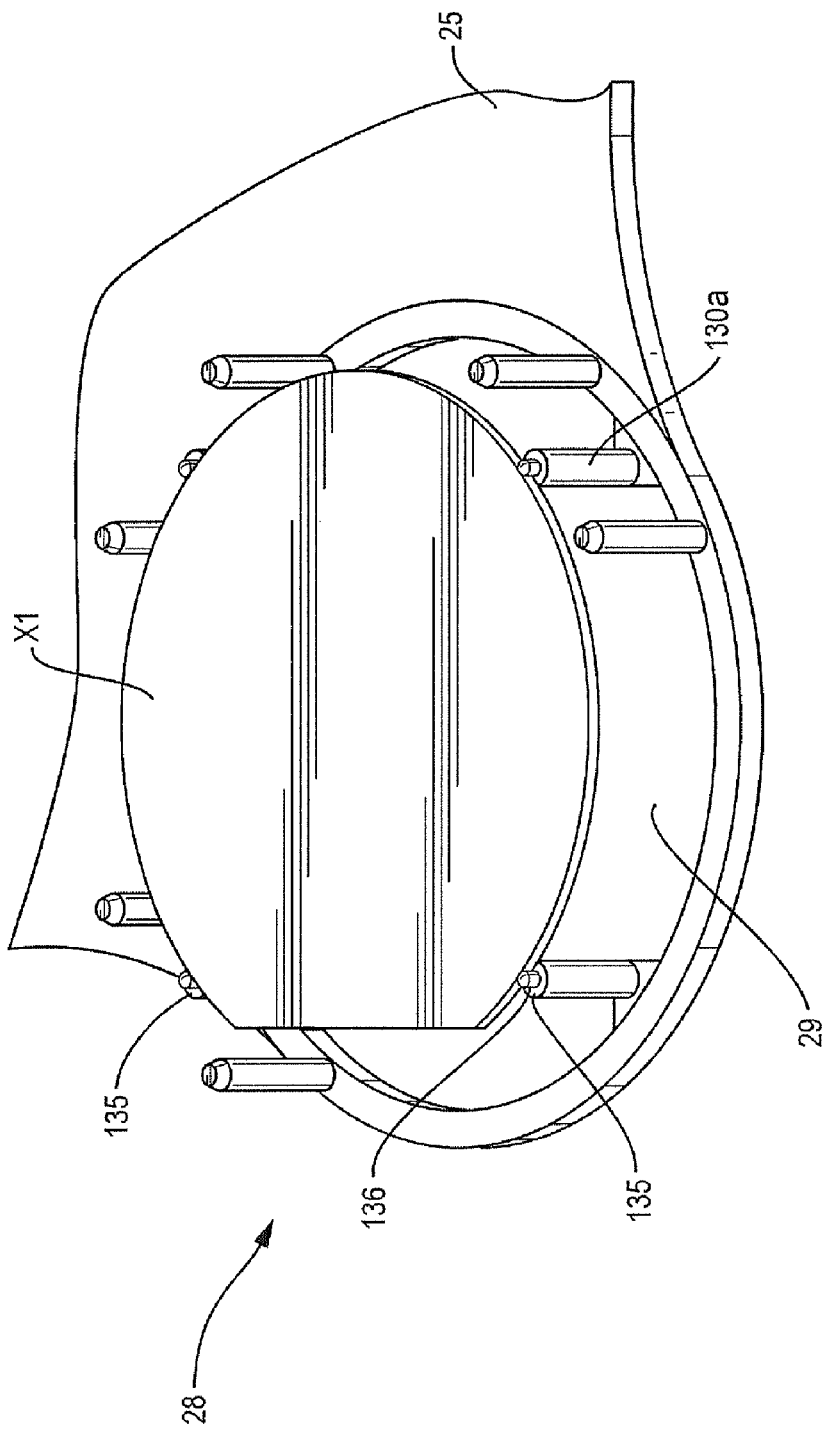
FIG. 8 is a perspective view of the site shown in FIG. 6 bearing a circular first body.

With continuing reference to FIGS. 6 and 7, each of the pins 130a comprises a lower cylindrical portion and an upper cylindrical portion of smaller diameter. The top flat surface of the lower cylindrical portion provides a horizontal ledge 135. The side of the upper cylindrical portion provides a vertical wall 136. The horizontal surface of the lower ledge 135 and the lower vertical wall 136 together constitute a lower step on the support pin 130a. With reference to FIG. 8, the lower steps delimit a circle approximately equal in size to the illustrative circular first body X1, shown in the drawing with a flat edge. The lower steps are configured to confine the first body X1 in place on the site 28. The ledge 135 supports the first body X1 while leaving it accessible to the lower susceptor 126 (FIG. 5) of the station 22a or 22b with which the site 28 is aligned. The circle delimited by the lower steps may illustratively have a diameter approximately equal to that of a standard semiconductor wafer. As used herein to describe workpiece supports configured to confine the first body X1 of a workpiece, the "vertical wall" 136 is not necessarily perpendicular to the horizontal ledge 135. In general, the vertical wall 136 is resolvable into two components including one vertical component.

Figure 9:
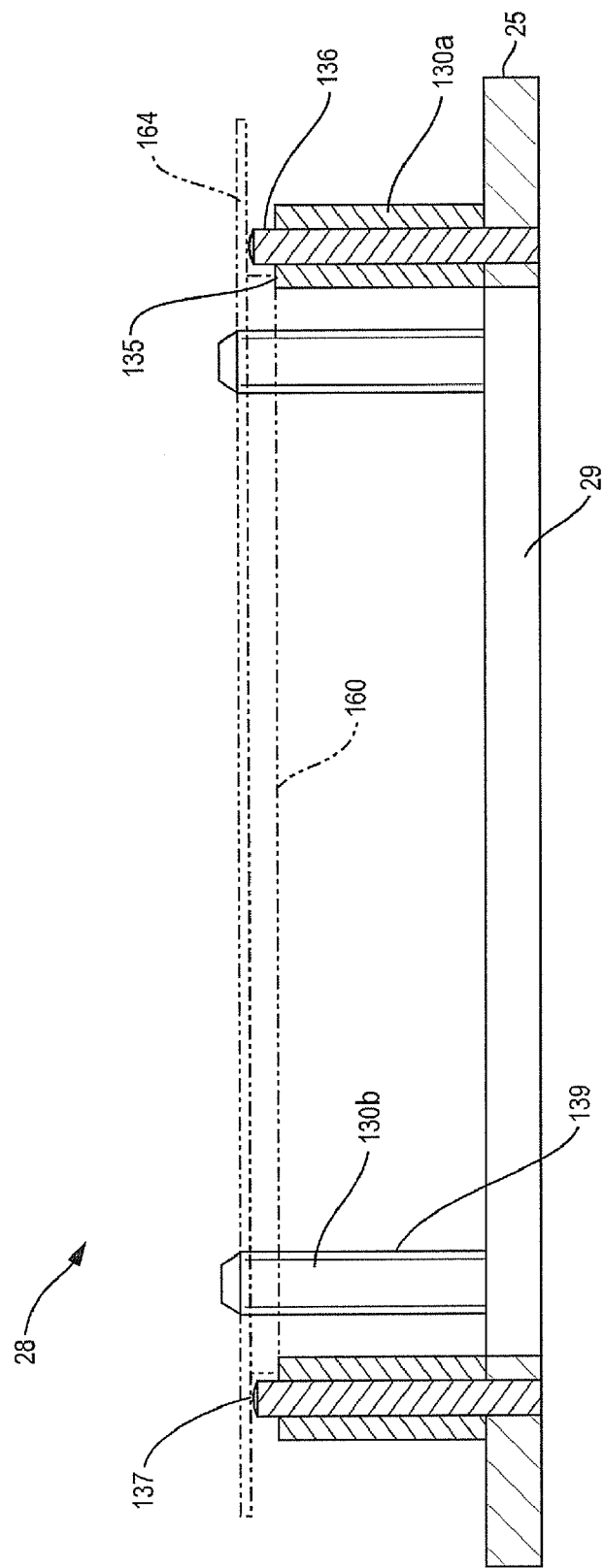
FIG. 9 is a sectional view of a site taken along the line 9-9 of FIG. 6.

With reference to FIG. 9, the lower steps are disposed around, and in aggregate constitute a lower shelf accommodating, a first interior space 160. The first interior space 160 corresponds in lateral extent, two dimensionally, to the first body X1 of the workpiece to be treated on the site 28. As used herein, an interior space's corresponding in lateral extent to a body means that the interior space is laterally larger than the body by a clearance desirable for easily loading and removing the body from the shelf defining the interior space. Illustratively, for thin circular bodies such as semiconductor wafers, such a clearance may be present when an interior space is about 0.05 to 1.0 mm greater in lateral extent than its corresponding body.

Figure 10:
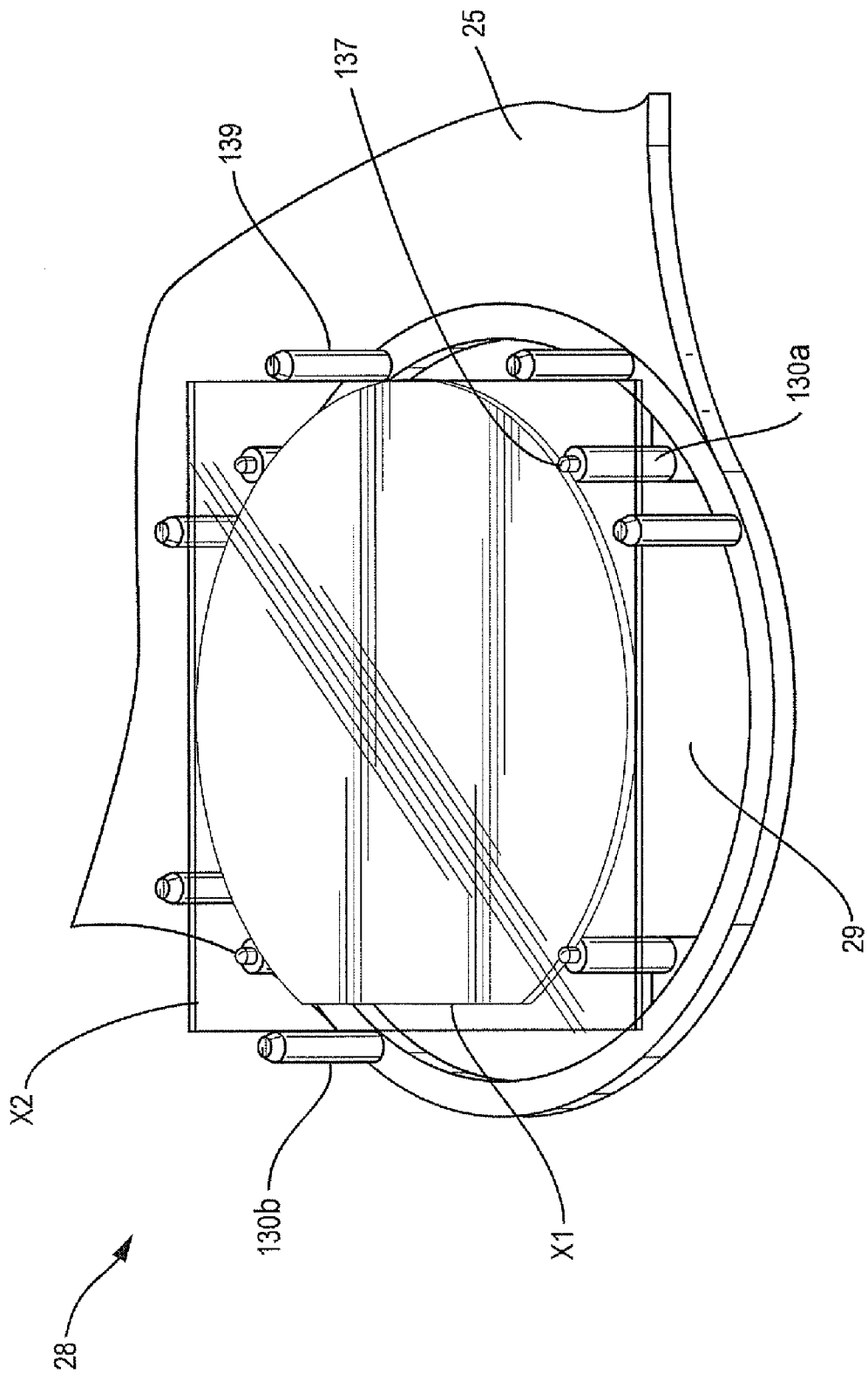
FIG. 10 is a perspective view of the site shown in FIG. 6 bearing a square second body over a circular first body.

With reference again to FIGS. 6 and 7, at each site 28 the top surfaces of the upper cylindrical portion of the support pins 130a are contoured to provide a horizontal support surface 137 outside the lateral extent of the first interior space 160 (FIG. 9). Each of the capture pins 130b has a cylindrical segment providing a vertical capturing surface 139 facing the aperture 29 of its site 28. The ledge constituted by the support surface 137 on the support pins 130*a* and the wall constituted by the vertical capturing surfaces 139 of the capture pins 130*b* in aggregate constitute an upper shelf. The upper shelf is configured to confine the second body X2 of the workpiece in place over the first body X1, as FIG. 10 shows.

Returning to FIG. 9, the upper shelf created by the support surface 137 and the vertical capturing surfaces 139 are disposed around and accommodate a second interior space 164 above the first interior space 160. The second interior space 164 corresponds in lateral extent, two dimensionally, to the second body X2. The extent of the vertical capturing surfaces 139 of a capture pin 130*b* above the support surface 137 defines the thickness of the second interior space 164. In order to reliably contain the second body X2 in place on the support surface 137 against adventitious lateral force, the second interior space 164 is illustratively at least about 50% greater in thickness than the second body X2.

At each site 28, the placement of the discrete support pins 130*a* and capture pins 130*b* leave most of the respective peripheries of the first and second interior spaces 160 and 164 unencumbered. The free peripheries facing the input and output gates 14 and 18 (FIG. 1) when the base 25 is in an operating orientation allow access to the interior spaces 160 and 164, between the respective workpiece supports 130*a* and 130*b*, by the load and unload robots 30 and 40, as discussed below.

In the embodiment, at each site 28 the second interior space 164 is larger in lateral area than the first interior space 160 and overhangs the first interior space 160 completely around its entire periphery. These features permit configuration of the lower susceptor 126 (FIG. 5) in each of the stations 22*a* and 22*b* to be able to pass upward through the first and second interior spaces 160 and 164 of an aligned site 28 and thereby lift both the first and second bodies X1 and X2 (FIG. 10) disposed on the lower ledges 135 and the support surface 137, respectively. For the shapes of the first body X1 and the second body X2 shown, the square interior space 164, delimited by the vertical capturing surfaces 139, may have an edge length exceeding the diameter of the circular interior space, delimited by the lower steps by, for example, approximately 5 mm or more.

In alternative embodiments, workpiece supports 130 may be configured to accommodate first and second interior spaces 160 and 164 either of which corresponds in lateral extent, two dimensionally, to a circular body or a noncircular body, for example a square or octagonal body such as a chamfered or corner-clipped square.

Figure 11:
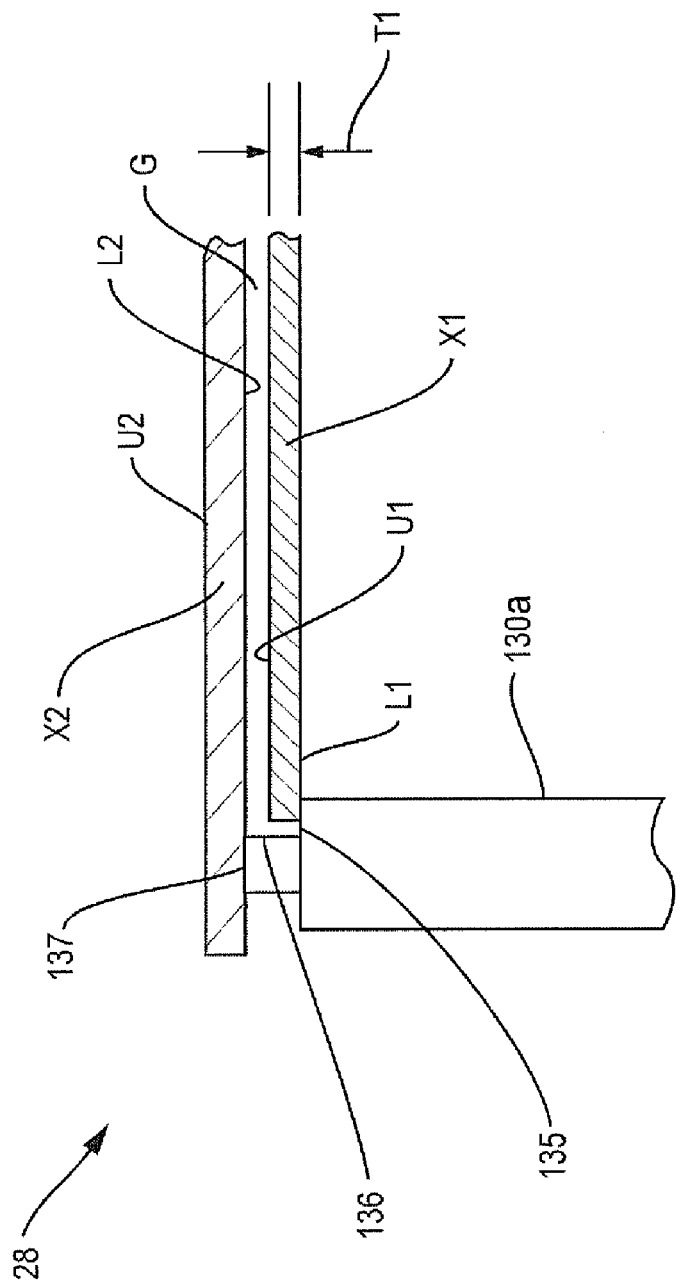
FIG. 11 is a sectional view of a support pin of the site supporting the first and second bodies as shown in FIG. 10.

With reference to FIG. 11, the site 28 is configured so that the vertical distance between the horizontal ledges 135 and the support surface 137, respectively, of the site 28 is greater than the thickness T1 of the first body X1. This vertical distance enforces an initial gap G between the bonding surfaces, which are the portions of the upper surface U1 of the first body X1 and the lower surface L2 of the second body X2 that overlap when the bodies are on the site 28. In the embodiment, the bonding surfaces are the entire upper surface U1 of the first body X1 and its vertical projection onto the lower surface L2 of the second body X2. The gap G affords management of bond front nucleation and progression during treatment, for example by evacuation of the bonding chamber 20' before contact initiation, without intermediate spacers or other solid bodies touching the bonding surfaces on U1 and L2. This feature enables a bonding method avoiding the surface damage hazards, bonder apparatus complexity, and reduced throughput associated with interposing spacers between the two bodies X1 and X2.

Figure 12:
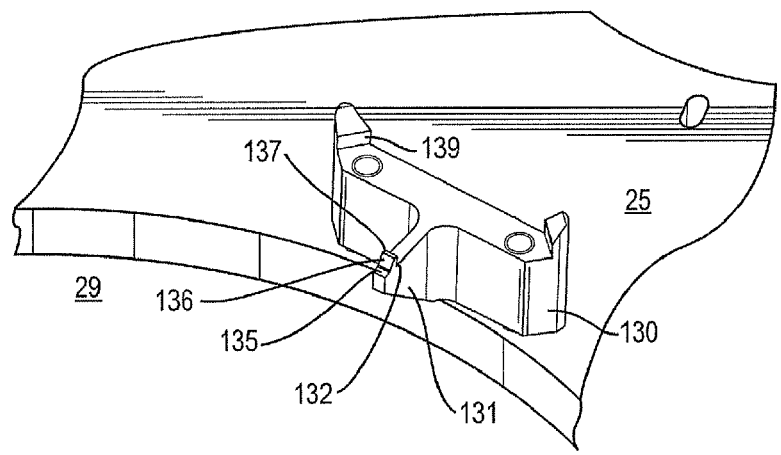
FIG. 12 is a perspective view of a composite-function workpiece support.
Figure 13:
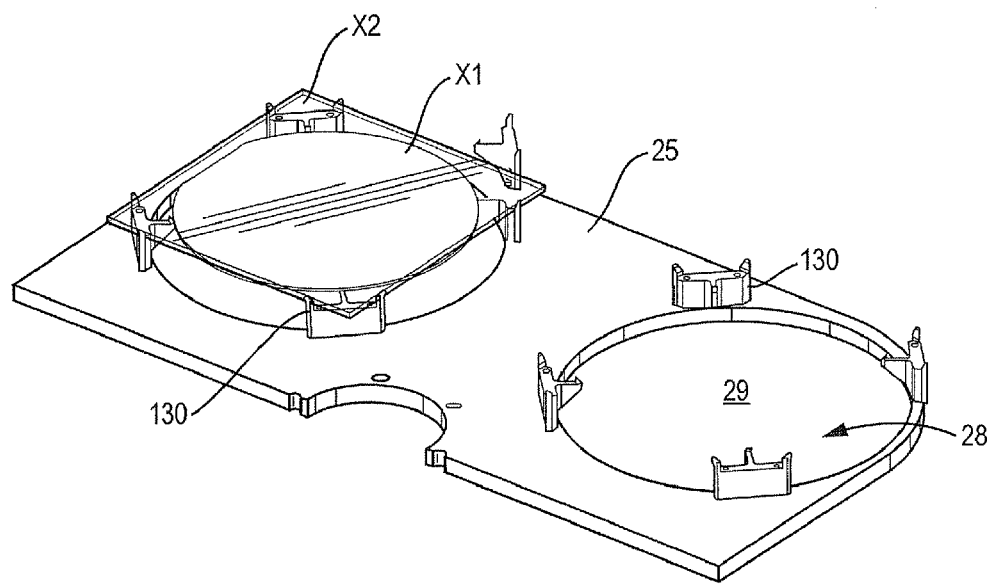
FIG. 13 is a perspective view of a base having sites defined by composite-function workpiece supports.

With reference to FIGS. 12 and 13, in an alternative embodiment, a single, composite-function workpiece support 130 is contoured to provide the functionality of both a support pin 130*a* (FIG. 6) and a pair of capture pins 130*b*. The sites 28 may each have four workpiece supports 130 disposed around its aperture 29 at 90-degree intervals. A projection 131 extends from the support 130 over the aperture 29 and terminates in a level sill serving as horizontal ledge 135. A tine 132 extending upward from the projection 131 provides a vertical wall 136 and horizontal support surface 137. Vertical capturing surfaces 139 are contoured in opposite ends of the support 130 to hold a corner of a square second body X2. The horizontal ledges 135, vertical walls 136, horizontal support surface 137 and vertical capture surfaces 139 of the composite-function workpiece supports 130 defining a site 28 function to confine the first body X1 and the second body X2 of a workpiece as described above for the support pins 130*a* and the capture pins 130*b*.

The relatively substantial footprint of the composite-function workpiece support 130 may enhance stability of a workpiece on a site 28 over varying temperature, particularly in the case of a base 25 made of metal.

As shown in FIG. 14, the illustrative load robot 30 (FIG. 1) has a stepped end effector 190, having a lower contact surface 192 and an upper contact surface 194. The lower contact surface 192 has raised edges 193 contoured to confine the first body X1 (FIG. 10) of the workpiece. The upper contact surface 194 has raised edges 195 contoured to confine the second body X2 of the workpiece. The lower contact surface 192 is sufficiently recessed compared to the upper contact surface 194 to maintain space between the first body X1 and the second body X2 on the stepped end effector 190. A plurality of vacuum channels 196 in communication with a vacuum source (not shown) controlled through the power apparatus 90 (FIG. 1) are provided in the lower contact surface 192 and the upper contact surface 194 to hold the first body X1 and the second body X2 in respective fixed positions on the stepped end effector 190. A sensor (not shown), such as an optical sensor, may be configured to sense the presence or absence of bodies on the stepped end effector 190 and/or body positions on the lower contact surface 192 and the upper contact surface 194.

The lower contact surface 192 and the upper contact surface 194 are arranged on the end effector 190 so as to fit between the workpiece supports 130*a* and 130*b* (FIG. 10) of one of the sites 28. For example, in the depicted embodiment of the stepped end effector 190, at the front and back ends of the end effector 190 the lower and upper supports 192 and 194 occupy an arc of less than 90 degrees of a circle having equal diameter with the first interior space 160 (FIG. 9).

The load robot 30 (FIG. 1) is operable to convey the end effector 190 through the input gate 14 of the bonding chamber 20' (FIG. 5), situate the end effector 190 in alignment over the second interior space 164 (FIG. 9) at a site 28, lower the end effector 190 through the second interior space 164 and the first interior space 160, and withdraw the end effector 190 from the bonding chamber 20'. The load robot 30 may be configured with two arms operable to load two workpieces simultaneously onto respective sites aligned with both of the loading stations 22*a*. Robotic components providing the requisite degrees of motion for one or more end effectors 190 on the load robot 30 are known to those skilled in the art.

The unload robot 40 (FIG. 1) may be structured analogously to the load robot 30, wielding the stepped end effector 190. Such an unload robot 40 is operable to move its end effector 190 into position under the first interior space 160 (FIG. 9) of a site 28 and lift a bonded structure from the support surface 137 and onto the upper contact surface 194.

In another approach, the stepped end effector 190 wielded by the unload robot 40 may implement the lower contact surface 192 and the upper contact surface 194 distributed on pins, for example on the top surfaces of four pins, for each body, similar to the support pins 130a (FIG. 6). The reduced contact area with each of the first body X1 and the second body X2 afforded by such an arrangement may reduce the effects of thermal shock on the workpieces during their removal from unloading stations as discussed below.

Figure 35:
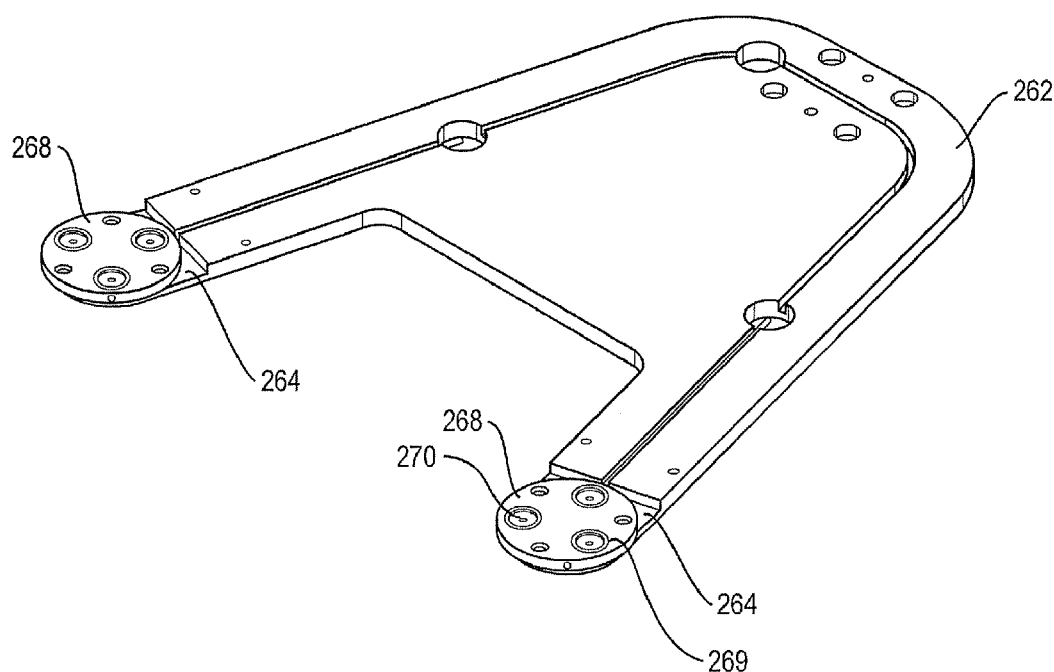
FIG. 35 shows a small end effector.

Alternatively, the unload robot 40 may be simplified to forego the capability of holding two bodies apart, given the integrated constitution of a workpiece after bonding. Accordingly, with reference to FIG. 15, the unload robot 40 may be fitted with a single-grip end effector 198. The single-grip end effector 198 is configured to hold a treated workpiece by only its first body X1. The lower contact surface 192 of the single-grip end effector 198 is contoured to grip the lower surface L1 (FIG. 11) of the first body X1 by vacuum pulled through the vacuum channels 196. An alternative embodiment of an end effector configured to hold a workpiece at the lower surface L1 is described below with reference to FIG. 35.

The arrangement of the of the workpiece supports 130a and 130b (FIG. 10), complementary to the end effectors 190 and 198 of the load and unload robots 30 and 40, respectively, and the ability to load and unload from opposite sides of the bonding chamber 20', afforded by the distinct, dedicated load and unload robots 30 and 40, may enhance throughput, providing a decreased per-workpiece treatment time in the system 10. The system 10 thus enables the capital cost savings associated with replacing four single-workpiece treatment structures with the illustrative four-workpiece treatment chamber 20' while mitigating time-intensive aspects of loading and unloading a batch in a closed chamber.

Fitted with the bonding chamber 20', the materials processing system 10 is operable to simultaneously treat a plurality of two-body workpieces, each comprising, e.g., the generally planar circular first body X1 and the square second body X2 (FIG. 10), to form respective bonded structures. Returning to FIG. 2, in an exemplary process sequence for forming bonded structures, the first and second bodies X1 and X2 of each of the workpieces are prepared for bonding (step 70). The bodies X1 and X2 each may have a high aspect ratio, on the order of 100 or more, between a lateral dimension and thickness and opposing upper and lower surfaces that are substantially flat and parallel. According to the intended end use of the bonded structure, preparation of one or both of the bodies X1 and X2 may comprise procedures known to those skilled in the art such as, e.g., growing or casting the body to a custom or standard diameter, e.g., 150 mm, 200 mm or 300 mm, 400 mm or greater, or edge length compatible with the configuration of the sites 28 (FIG. 4); removing the body from a larger ingot such as by slicing; etching one or more faces of the bodies X1 and X2 to a desired surface roughness; diffusion doping the body to create an n-type or p-type layer; determining a crystallographic orientation of body material; establishing a relative orientation between the bodies X1 and X2, which may be facilitated by the clipped morphology of a flat-edge circle such as the first body X1 shown in FIG. 10; fabricating wiring; depositing a transparent conductive oxide or an amorphous silicon layer; depositing or growing an oxide or nitride layer; depositing a conductive layer or stack of layers; and cleaning surfaces of the body such as by megasonic rinsing with spin drying or otherwise treating surfaces to remove chemical residues and particles, for example any particles exceeding 2 μm in diameter.

Depending on the bonding mechanism to be effected in the bonding chamber 20', one or both of the bodies X1 and X2 may be coated on one side with an adhesive or a fusible substance that melts during bonding to join the two bodies; or one or more surfaces of the bodies may activated with plasma. Body preparation for techniques such as thermocompression, adhesive, plasma and anodic bonding are described in co-owned U.S. patent application Ser. No. 12/335,479, Agarwal et al., "Methods of Transferring a Lamina to a Receiver Element," the disclosure of which is incorporated herein in its entirety by reference. As used herein, the upper surface U1 (FIG. 11) of the first body X1 and the lower surface L2 of the second body X2 refer to the uppermost surface of the first body X1 and the lowermost surface of the second body X2, respectively, when the workpiece is placed on one of the sites 28 for treatment, whether the surface U1 or L2 represents the bulk, interior material of the respective body, X1 or X2, or a surface coating or layer, for example, an applied material.

One or both of the bodies X1 and X2 may be of an electronics-grade semiconductor material, such as silicon, germanium, silicon germanium, or a III-V or II-VI compound such as gallium arsenide or indium phosphide. The semiconductor material may have a monocrystalline, polycrystalline, multicrystalline or microcrystalline microstructure. Polycrystalline and multicrystalline semiconductors are understood to be completely or substantially crystalline. A polycrystalline semiconductor body is comprised of crystals on the order of 1 mm in size. A multicrystalline semiconductor body has a grain size on the order of 1,000 Angstrom units. By contrast, a microcrystalline semiconductor may be fully crystalline or may include fine microcrystals in an amorphous matrix. Microcrystals in a microcrystalline semiconductor body are on the order of 100 Angstrom units in size. One of the bodies X1 and X2 may be of glass, ceramic, metal, metal-containing compound, plastic, metallurgical silicon, or a layered stack of diverse materials.

With continuing reference to FIGS. 1 and 2, the computer system 80 is operated to prepare the bonding chamber 20' for use (step 72) by, e.g., putting the lower susceptors 126 (FIG. 5) into respective rest positions below respective sites 28 and retracting the plunger tips 152 above respective second interior spaces 164 (FIG. 9) and out of the way of the load robot 30. Having all of sites 28 vacant, the bonding base 25 is rotated to an operating orientation so that two sites 28a and 28b (FIG. 4) are aligned with the loading stations 22a and two sites 28c and 28d are aligned with the unloading stations 22b. The power apparatus 90 may be furthermore operated to activate the lower heaters 120 and the upper heaters 140 to heat the respective susceptors 126 and 146 to respective bonding temperatures, either of which may be, e.g., on the order of 200° C., 300° C., 400° C., 500° C., 600° C., 700° C., 800° C., or greater. Illustratively the bonding temperatures of both of the susceptors 126 and 146 in each station 22a or 22b are approximately equal and lie between 200° C. and 800° C., between 350 and 550° C., or between 400 and 500° C.

The prepared first and second bodies X1 and X2 are arranged flat on the lower contact surface 192 (FIG. 14) and the upper contact surface 194, respectively of the stepped end effector 190 in a substantially parallel, spaced-apart stack. The bodies may be placed onto the contact surfaces 192 and 194 manually or by a front-end robot (not shown), for example. Vacuum is activated through the vacuum channels 196 to hold the first and second bodies X1 and X2 in place on the contact surfaces 192 and 194 during movement of the load robot 30.

The bonding chamber 20' is purged with nitrogen as the input gate 14 is opened. The load robot 30 is operated to load the first body X1 and the second body X2 onto each of the sites 28a and 28b (step 74) aligned with respective loading stations 22a. The end effector 190 of the load robot 30 is moved through the input gate 14 and positioned over the workpiece supports 130 aligned in each of the loading stations 22a. For each of the aligned sites 28a and 28b, the end effector 190 is lowered to settle the bodies X1 and X2 on the lower ledges 135 and upper support surface 137 (FIG. 6) as the vacuum is released. A sensor (not shown) on the load robot 30 or inside the bonding chamber 20' may verify proper placement of the bodies in the chamber 20'. When placement is satisfactory, the end effector 190 is retracted from the bonding chamber 20'.

Figure 16:
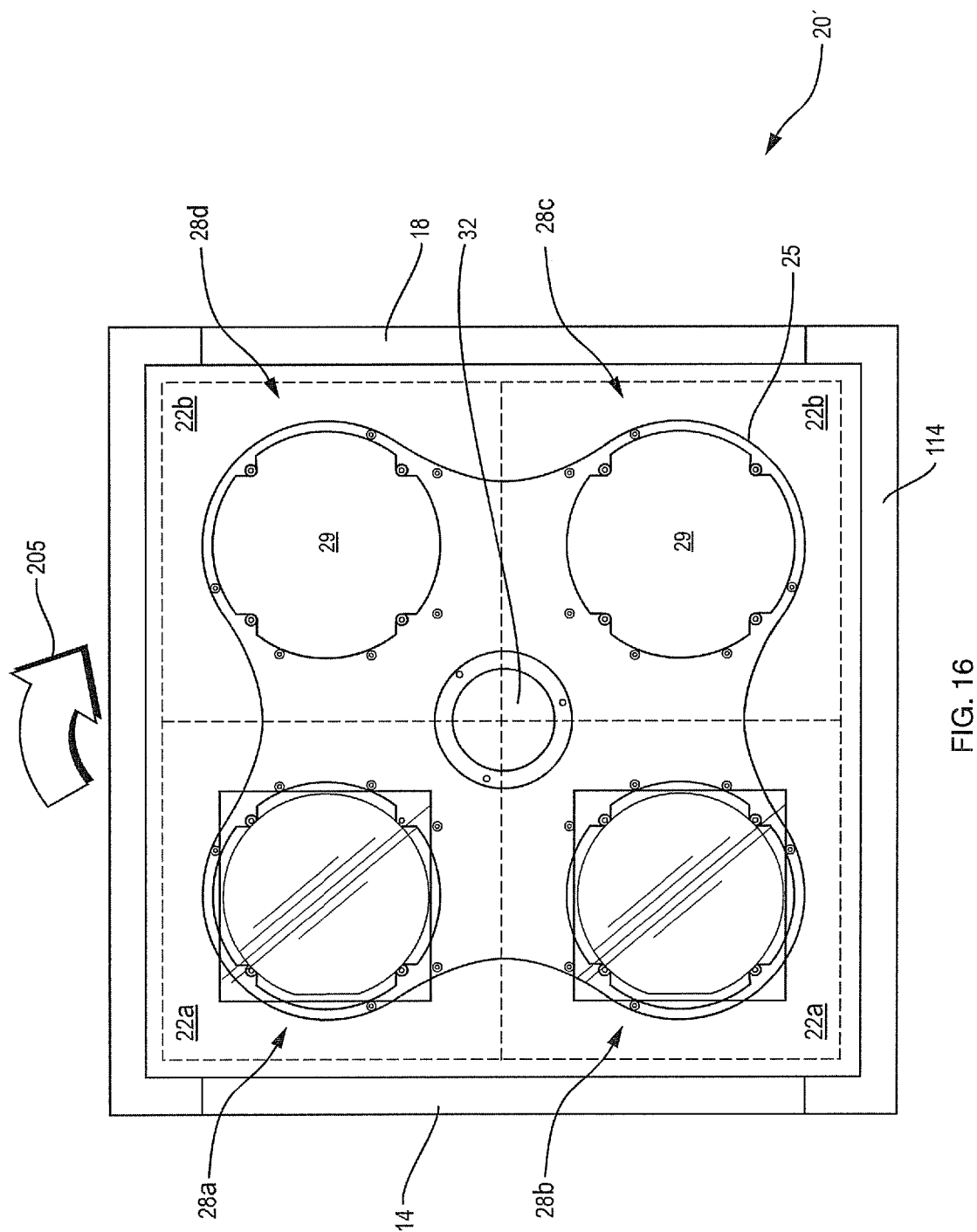
FIG. 16 is a plan view of the bonding chamber, sectioned as shown in FIG. 4, with workpieces loaded on sites in the loading stations.
Figure 17:
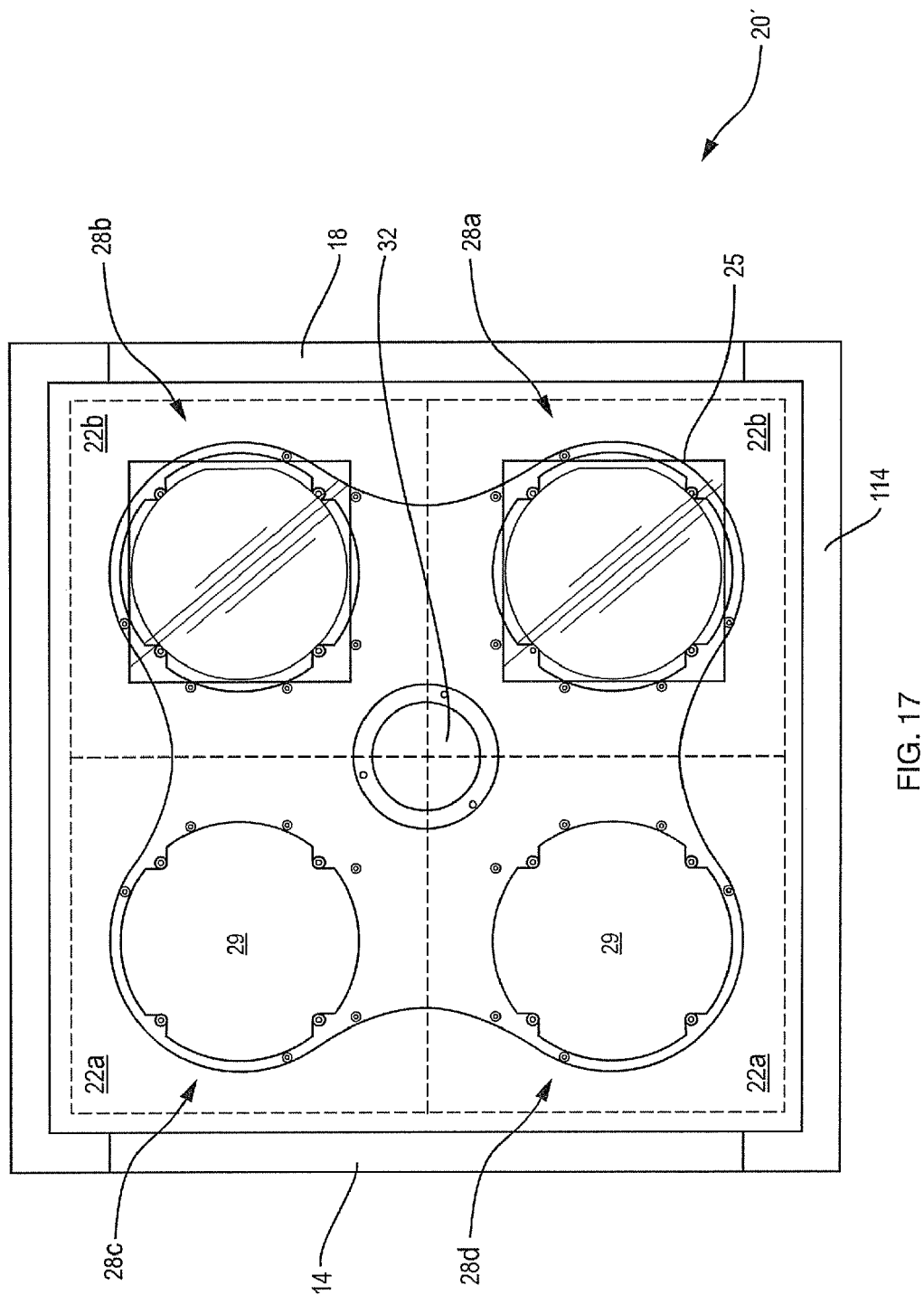
FIG. 17 is a plan view of the bonding chamber, loaded as shown in FIG. 16, after base rotation.
Figure 18:
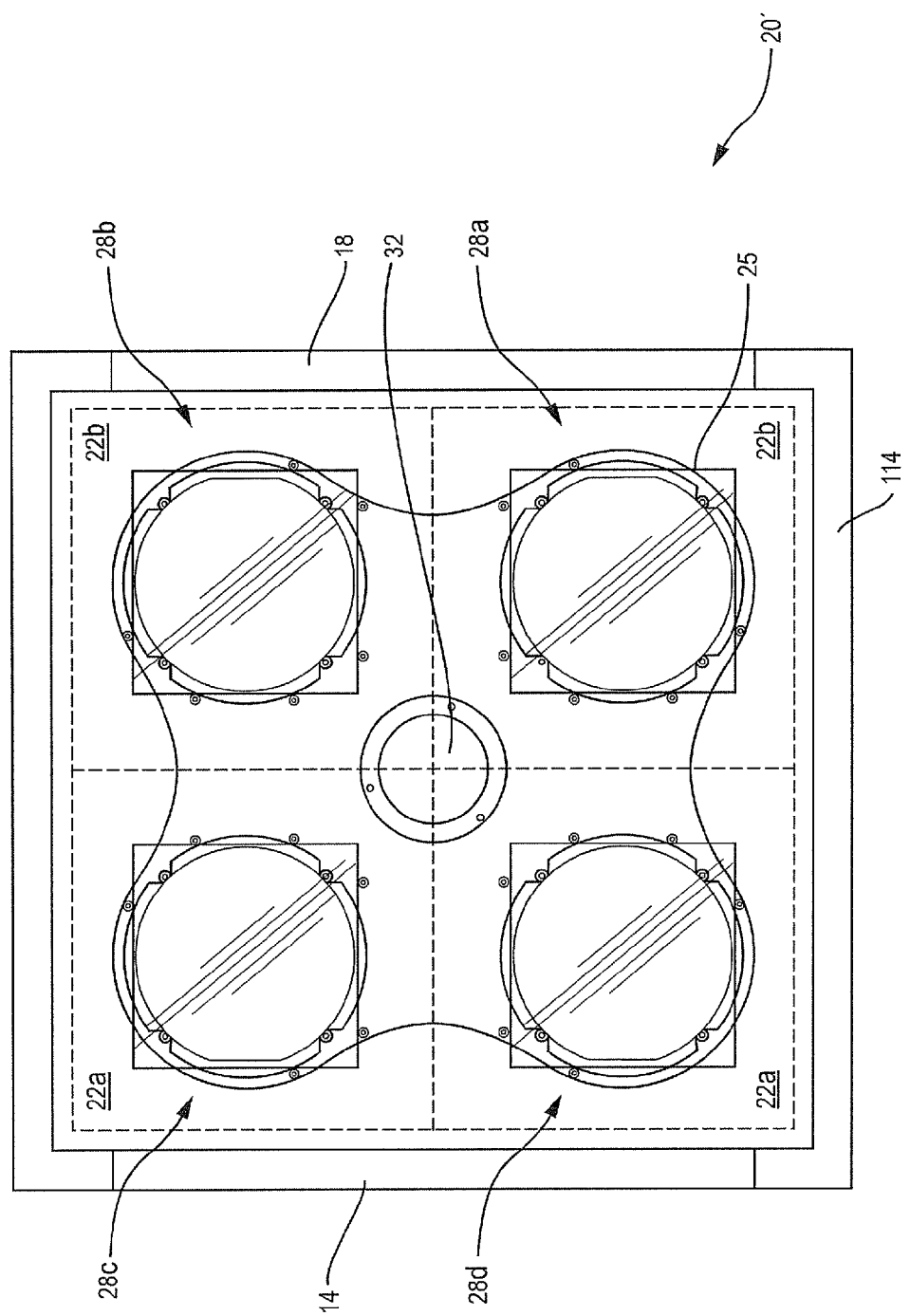
FIG. 18 is a plan view of the bonding chamber, sectioned as shown in FIG. 4, with all sites loaded.

With a workpiece now in each of the loading stations 22a, as shown in FIG. 16, the base 25 is prepared for further loading by operation of the power apparatus 90 to rotate the base 25 in a forward direction 205 through 180° to another operating orientation in which one vacant site is aligned with each of the two loading stations 22a (step 76). With the sites 28c and 28d now aligned with respective loading stations 22a, as shown in FIG. 17, the load robot 30 is operated to load a workpiece onto each of the sites 28c and 28d (step 74). FIG. 18 shows the resulting fully loaded base 25.

Figure 19:
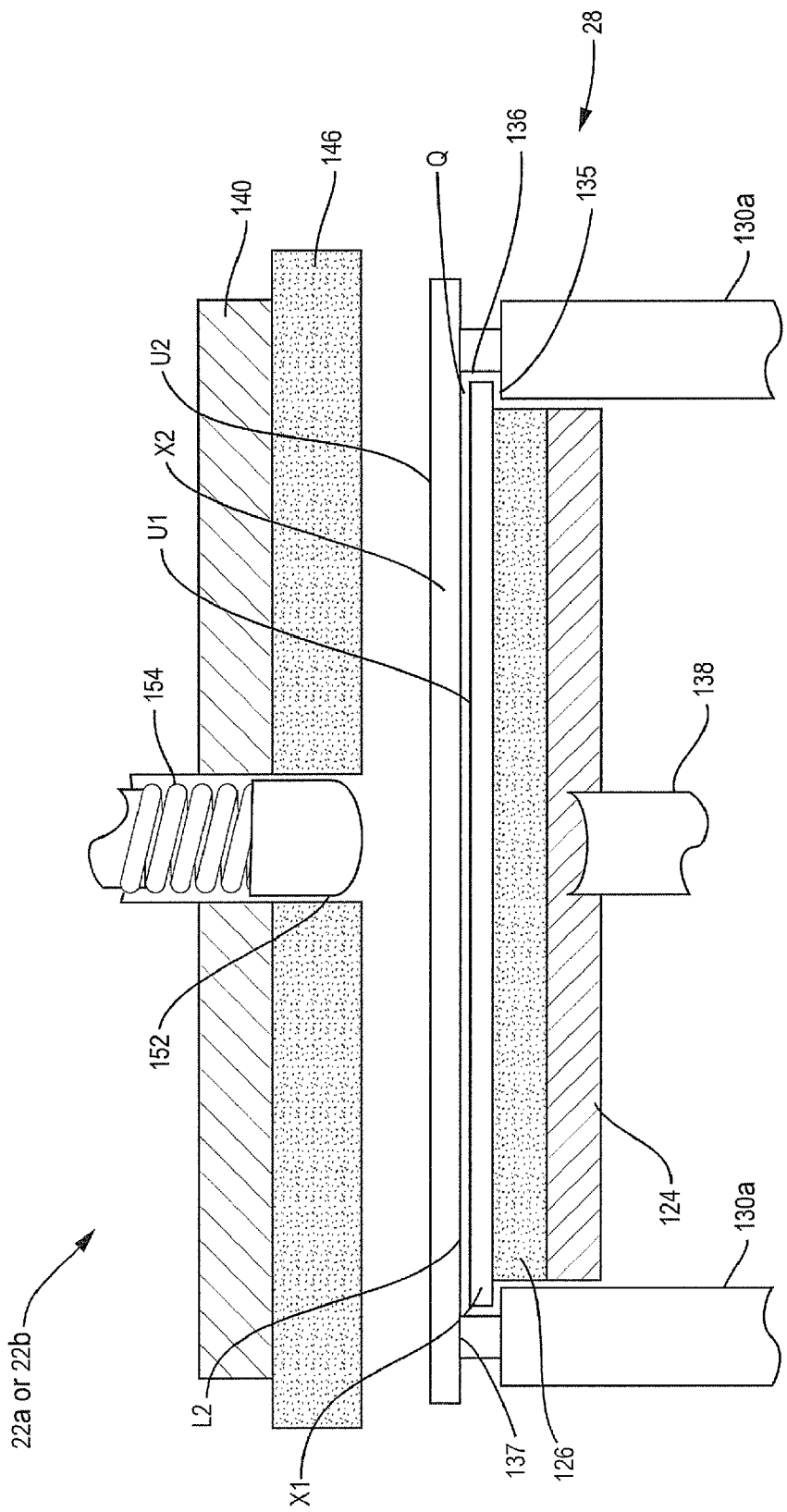
FIG. 19 is a sectional view of a station of the bonding chamber shown in FIG. 5, and an aligned loaded site, shown in FIG. 10, with a lower susceptor raised to lift the first body.

The input gate 16 is closed, the nitrogen purge ended and the bonding chamber 20' evacuated. With continuing reference to FIGS. 2 and 5, after sufficient time for thermal equilibration in the bonding chamber 20' has passed, the base 25 remains at rest while all of the stations 22a and 22b are operated simultaneously to treat the workpieces (step 78). Accordingly, the susceptor lift assemblies 138 are activated to raise the respective lower susceptors 126 toward the respective first bodies X1 of the workpieces on respective aligned sites 28. To accomplish bonding, the lift assemblies 138 continue upward until the respective lower susceptors 126 have lifted the respective first bodies X1 from the respective lower shelves. With reference to FIG. 19, in each station 22a or 22b the lower susceptor 126 is brought to rest holding the upper surface U1 of the first body X1 at a predetermined value of the gap G, designated the separation Q, from the lower surface L2 of the second body X2, which remains on the support surface 137.

Figure 20:
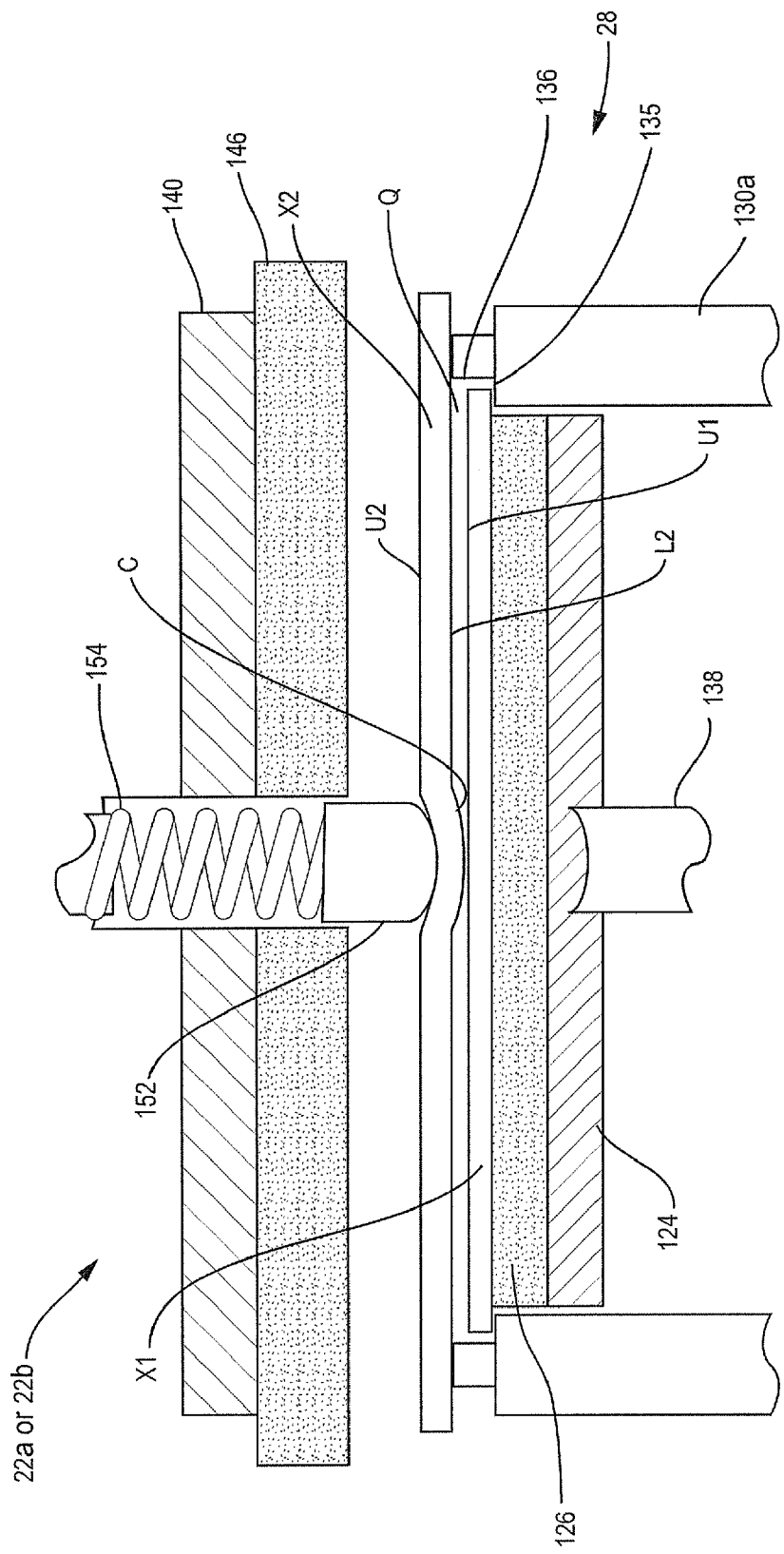
FIG. 20 is a sectional view as in FIG. 19 with the plunger tip flexing the second body.

The plunger drives 158 are next activated, to drive each of the plungers 150 downward so that in each station 22a or 22b the tip 152 touches the upper surface U2 of the second body X2 loaded onto an aligned site 28 with force sufficient to bow the second body X2. With reference to FIG. 20, this bow forms a convexity C approximately at the center of its lower surface L2, facing the first body X1. After the second body X2 has been bowed, the separation Q remains between the upper surface U1 and the lower surface L2 near the horizontal ledges 135. Under the plunger tip 152 the first and second bodies X1 and X2 approach closer than the predetermined separation Q.

Figure 21:
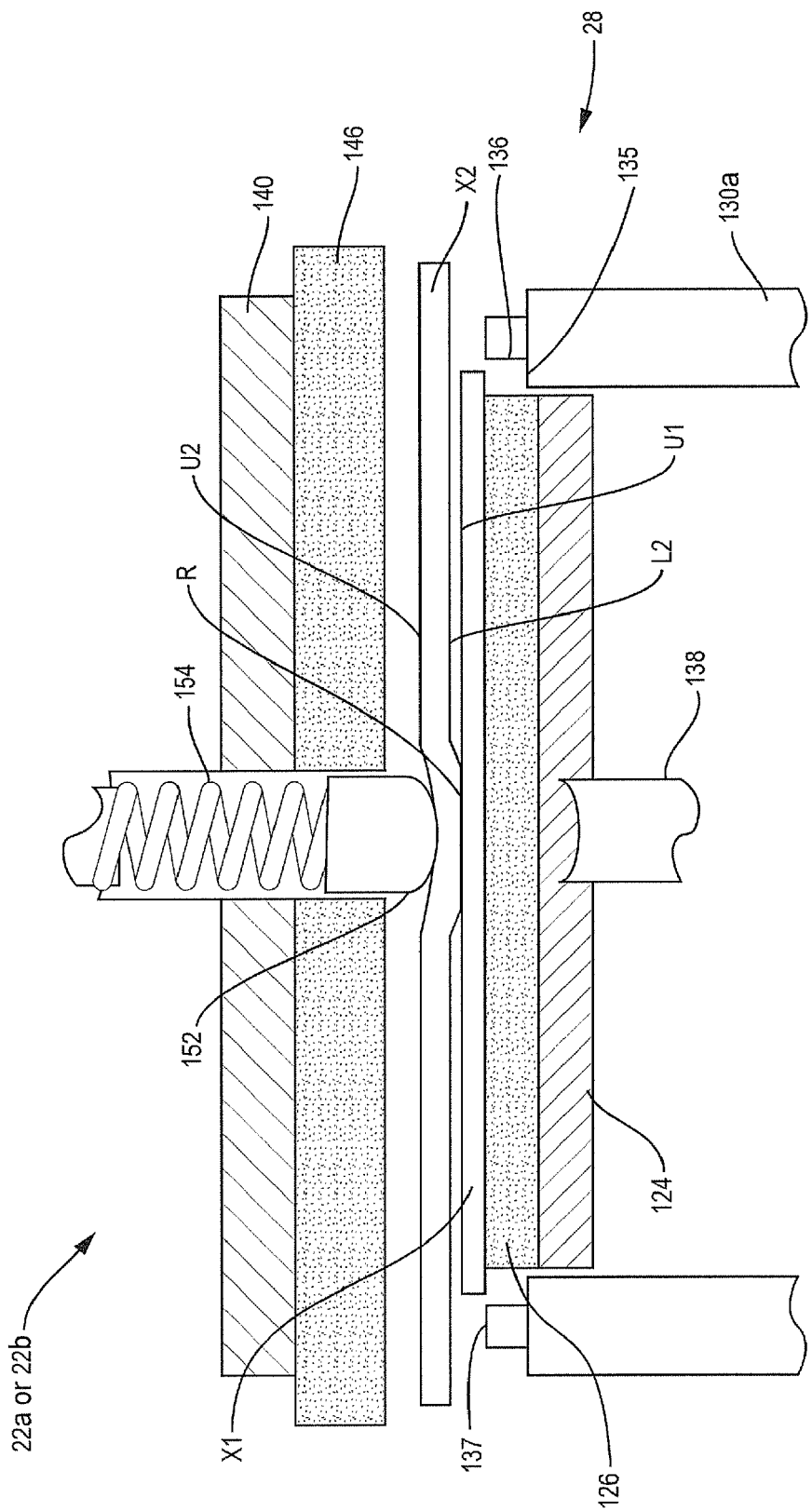
FIG. 21 is a sectional view as in FIG. 20 with the lower susceptor further raised to expand the contact area between the first body and the second body.

At each station 22a or 22b the susceptor lift assembly 138 resumes upward motion to bring the second body X2 loaded onto an aligned site 28 against the upper susceptor 146. In one approach, the elevation of the plunger drive assembly 158 is fixed while the second body X2 is rising. When the first body X1 rises sufficiently to close the separation Q under the convexity C, contact is initiated between the upper surface U1 and the lower surface L2. Ideally, the contact occurs over a continuous circular interface region R, as shown in FIG. 21.

Figure 22:
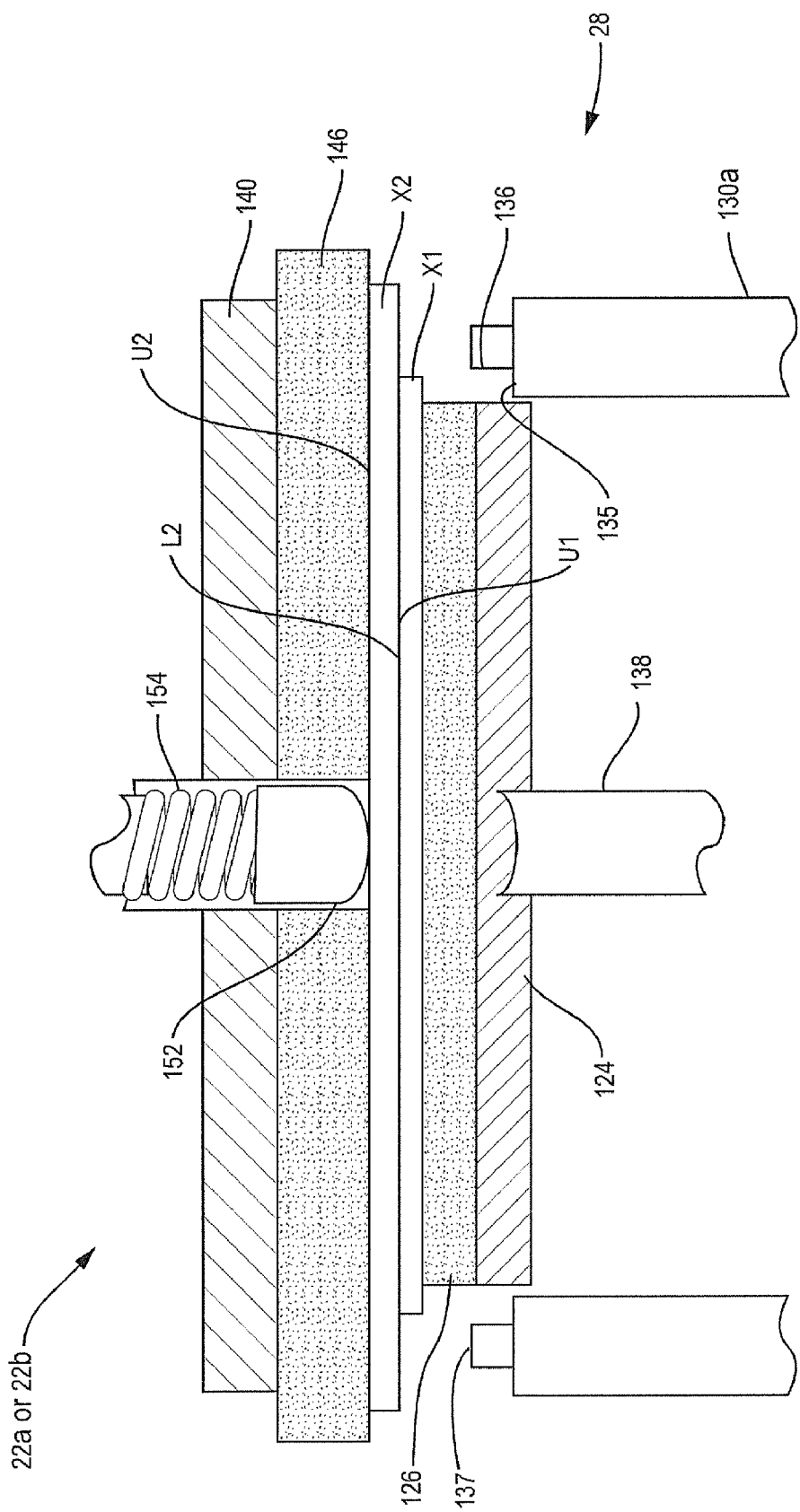
FIG. 22 is a sectional view as in FIG. 21 with the first and second bodies pressed between the lower and upper susceptors.

As the first body X1 lifts the second body X2 off the upper shelf 137 and continues upward, the spring 154 is compressed and the force of the tip 152 against the upper surface U2 of the second body X2 increases. The contact front around the circular interface region R may advance approximately radially. FIG. 21 shows the second body X2 supported by the first body X1 through the contact region R. The susceptor lift assembly 138 continues upward until the contact region R substantially covers the entire upper surface U1 and the upper surface U2 of the second body X2 is against the upper susceptor 146, as shown in FIG. 22.

Alternatively, during step 78 the plunger drive 158 is operated to track the position of the upper surface U2, thus retracting as the second body X2 rises, thereby maintaining a constant force between the tip 152 and the upper surface U2. Also, the contact region R may be precipitated by the initial descent of the plunger tip 152 instead of by the ascent of the first body X1 toward the convexity C.

The first and second bodies X1 and X2 loaded onto each site 28 are held under pressure between the respective lower and upper susceptors 126 and 146 until the contact area R is converted to a bond. The compression may be maintained, for example for a predetermined period on the order of one minute, five minutes, fifteen minutes, thirty minutes or more. In general, completion of the bond at the upper surface U1 of the first body X1 and the lower surface L2 of the second body X2 involves the application of pressure between the susceptors 126 and 146 and the transfer of heat from the susceptors 126 and 146 through the respective bodies X1 and X2 to the contact region R. Step 78 may additionally involve, for example, the application of a bias voltage across the bodies X1 and X2 to achieve anodic bonding. Alternatively, the bond is completed by the fusion and solidification of material at the upper surface U1 or lower surface L2, for example, a preapplied metal coating applied to one or both of the surfaces U1 and L2 during step 70. Diverse bonding techniques are described in U.S. patent application Ser. No. 12/335,479, earlier incorporated by reference.

When the bonds between the respective first and second bodies loaded onto respective sites 28 are complete, the susceptor lift assemblies 138 are simultaneously retracted to remove the respective upper surfaces U2 of the respective second bodies X2 from the respective upper susceptors 146. At each site 28, the plunger drive 158 may be engaged to push the plunger assembly 150 downward to help separate the upper surface U2 of the second body from the upper susceptor 146. The plunger tip 152 may furthermore follow the upper surface U2, either by passive extension of the spring 154 or under force from the plunger drive 158. In this case, the presence of the plunger tip 152 on the upper surface U2 may inhibit undesired lateral motion on the lower susceptor 126 by the treated workpiece, now a bonded structure formed from X1 and X2.

Figure 23:
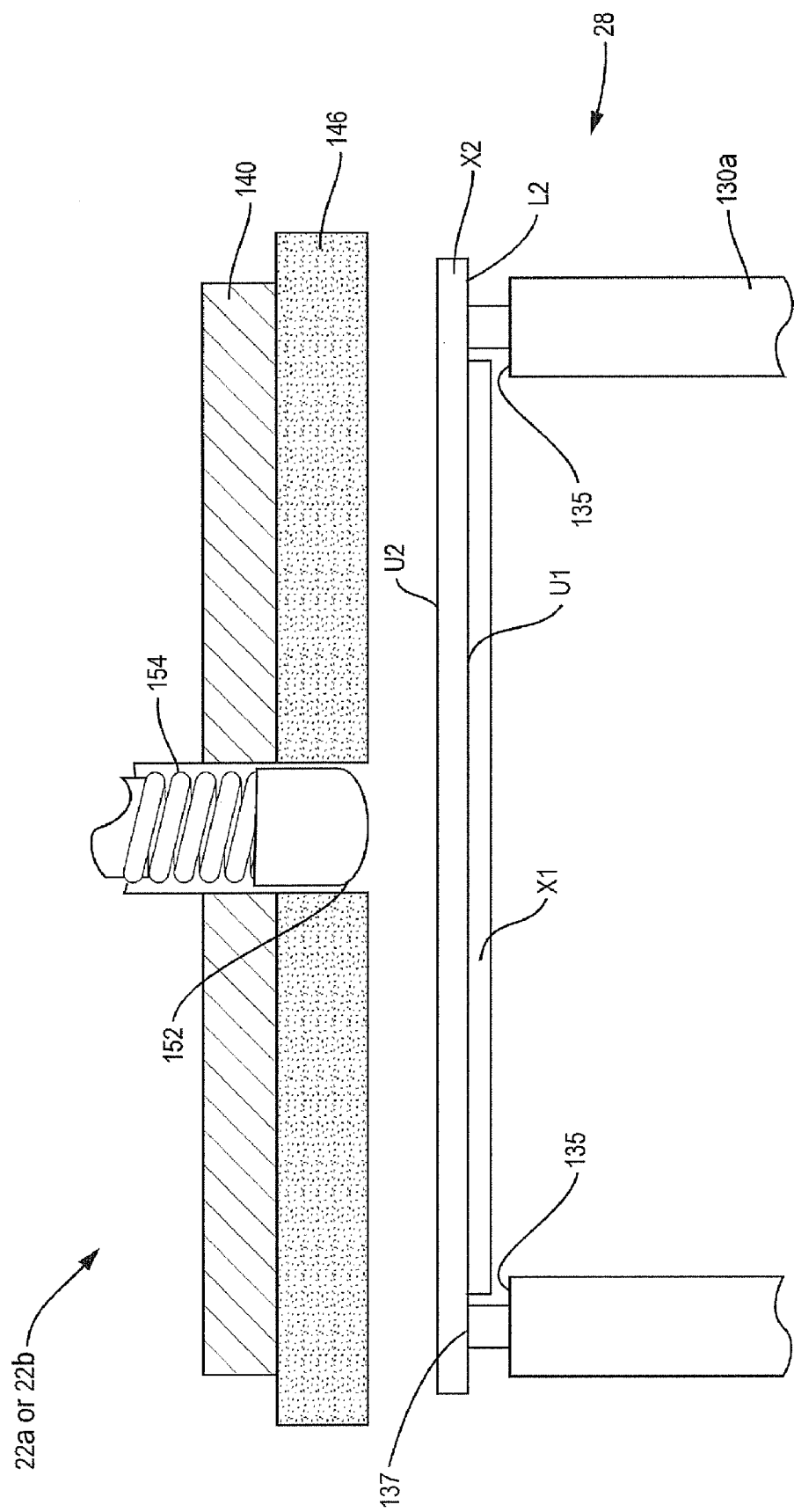
FIG. 23 is a sectional view as in FIG. 22 with the bonded workpiece settled on the upper surfaces of the support pins.

When the unbonded portion of the lower surface L2 reaches the horizontal support surface 137 on the respective support pins 130a at a site 28, the bonded structure comes to rest, as shown in FIG. 23, and the lower susceptor 126 continues to its rest position below the aligned site 28. At this point, the plunger tip 152 may be retracted into the upper susceptor 146.

The power apparatus 90 and the atmosphere apparatus 100 of the system 10 are operated to bring the environment in the bonding chamber 20' to a suitable temperature and composition for opening the chamber 20', for example by cutting off vacuum or backfilling with an inert gas.

The output gate 18 is opened and, with reference again to FIG. 18, the output shuttle 40 (FIG. 1) is operated to remove a workpiece, now treated, from each of the sites 28a and 28b aligned with respective unloading stations 22b (step 80). To remove a treated workpiece from one of the sites 28a and 28b, the single-grip end effector 198 (FIG. 15) wielded by the unload robot 40 is positioned at the site 28a or 28b lower than the lower ledges 135. The unload robot 40 may hold its end effector in the bonding chamber 20' for some residence time, e.g., on the order of several seconds or up to about 30 seconds, to allow thermal equilibration before contact with the workpiece. The load robot 40 raises the end effector 198 so that its lower contact surface 192 holds the lower surface L1 of the first body X1 of the treated workpiece. The lower contact surface 192 grips the workpiece through the vacuum channels 196 while the robot 40 lifts the end effector 198 clear of the workpiece supports 130a and 130b. The end effector 198 retracts from the chamber 20', removing the workpiece from the chamber 20' through the output gate 18.

Figure 24:
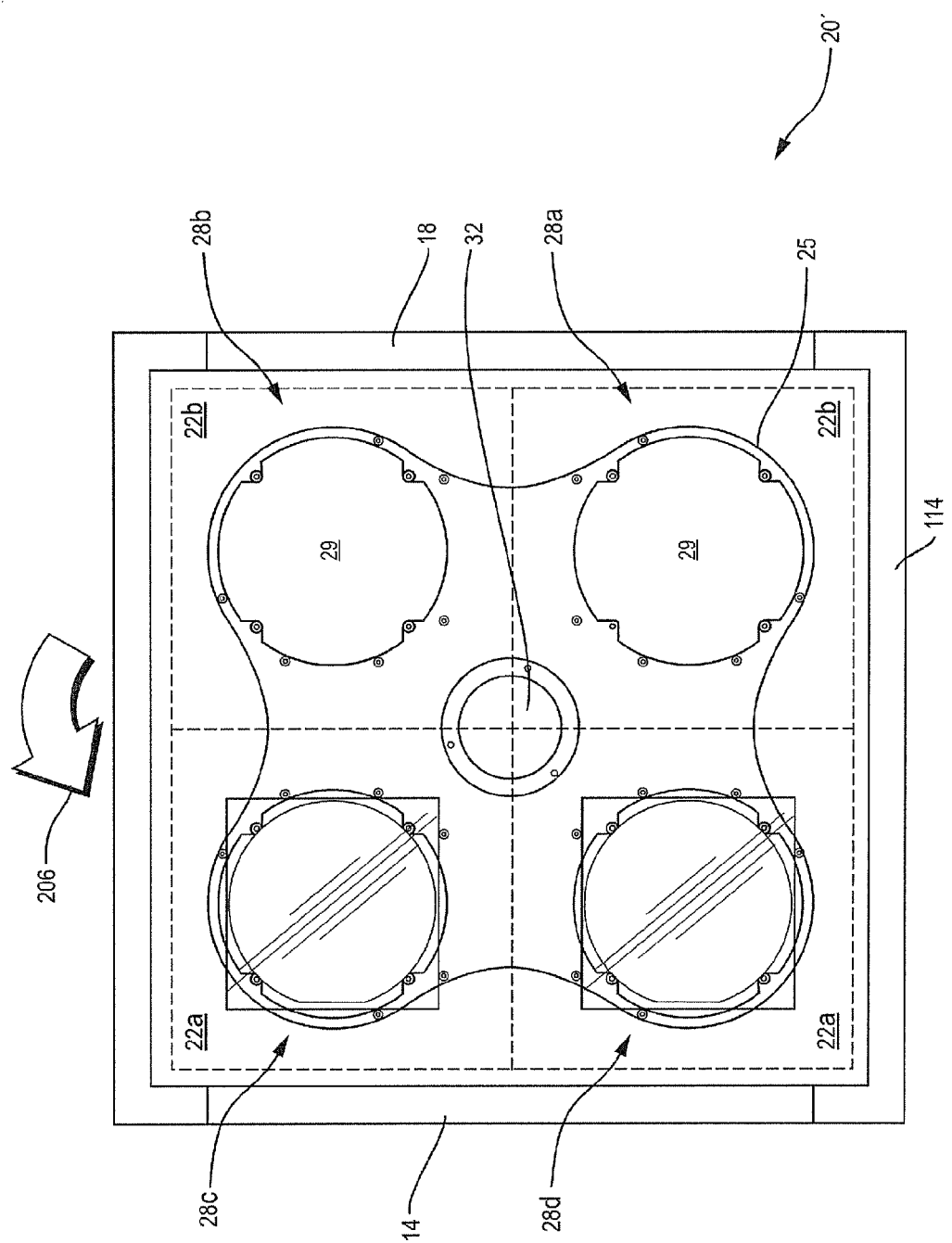
FIG. 24 is a plan view as in FIG. 18 after the sites aligned with the unloading stations have been unloaded.
Figure 25:
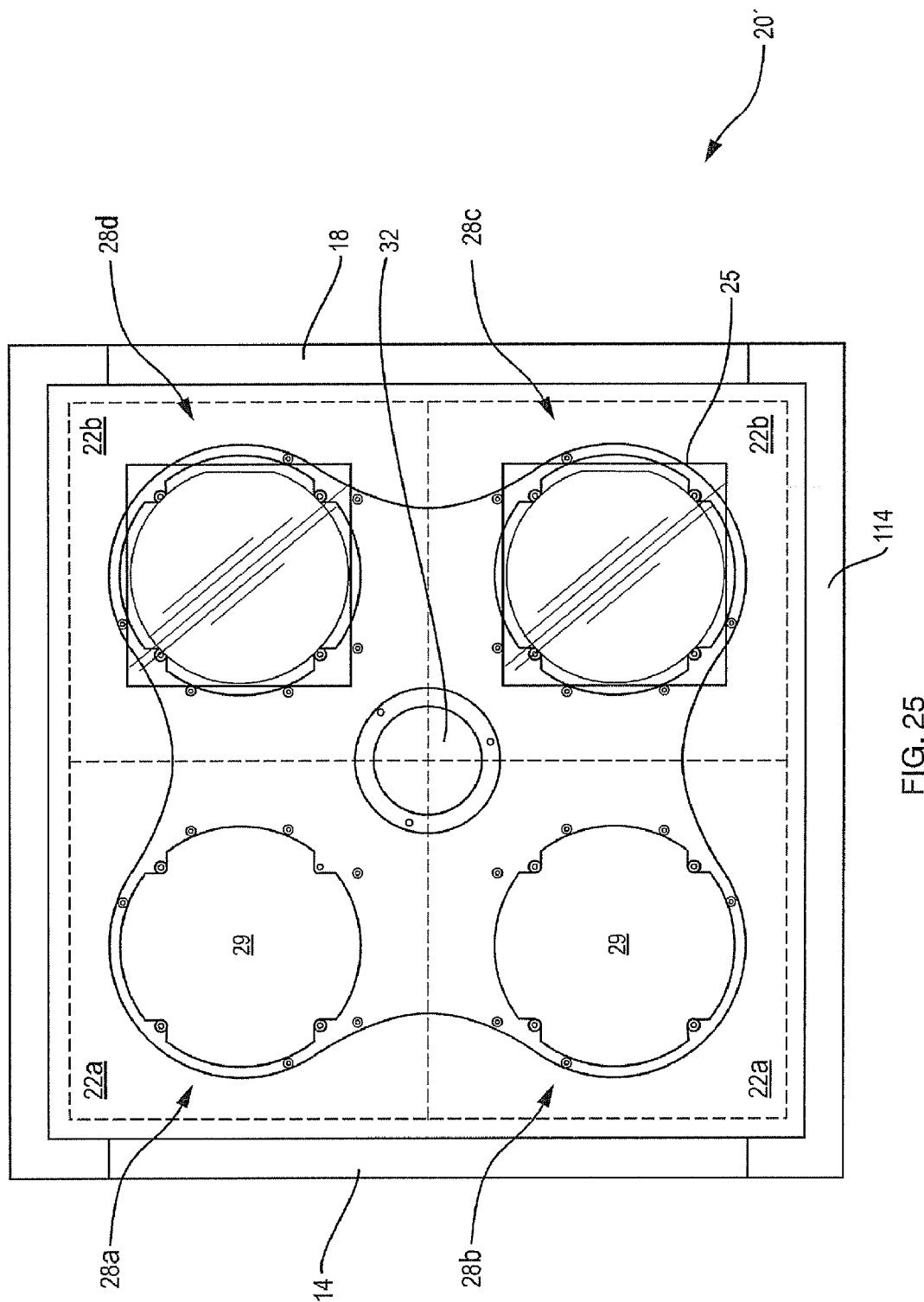
FIG. 25 is a sectional view as in FIG. 24 after base rotation.

With the sites 28a and 28b aligned with the unloading stations 22b now vacated, as shown in FIG. 24, the base 25 is prepared for further unloading by rotation in a reverse direction 206 through 180° (step 82) to bring nonvacant sites into unloading stations 22b. In the resulting operating orientation the sites 28c and 28d are aligned with respective unloading stations 22b, as shown in FIG. 25. The unload robot 40 is operated to unload a workpiece from each of the sites 28c and 28d (step 80), leaving all sites 28 on the base 25 vacant, as shown in FIG. 4.

In an exemplary embodiment adapted to make a photovoltaic-ready silicon-glass bonded structure by anodic bonding in the bonding chamber 20' of the system 10, the workpiece supports 130a and 130b (FIG. 10) are configured to hold a wafer X1 about 150 mm in diameter with a clearance of about 0.2 mm around the perimeter of the wafer X1. Each lower ledge 135 is about 2 mm in radial extent and the lower vertical wall 136 is greater than about 3 mm tall. The capture pins 130b are adapted to contain a square second body X2 approximately 1.0 mm to 3.5 mm in thickness and 154 mm in length, with a clearance of about 0.2 mm around the perimeter of the second body X2. The support surface 137 is about 2 mm in radial extent on each support pin 130a and the vertical capturing surfaces 139 are at least about 2 mm taller than the support pins 130a.

The power apparatus 90 incorporates 60 mA power supply configured to apply a bias voltage between the lower and upper susceptors 126 and 146. The plunger tip 152 is 10 mm in diameter and of silicon carbide. The susceptors 126 and 146 are also of silicon carbide, which resists attack by sodium ions in contact with a glass body under bias.

With reference again to FIG. 2, in step 70, the first bodies X1 are each prepared by providing a round silicon monocrystal, referred to as a silicon wafer, illustratively on the order of 0.7 mm thick and 150 mm in diameter. The silicon wafer X1 is furthermore implanted with $8 \times 10^{16}$ hydrogen ions/cm$^2$ through what becomes the upper surface U1 when the silicon wafer X1 is placed in the bonding chamber 20'. With reference to FIG. 26, the implanted hydrogen ions define a cleave plane P, illustratively about 3.0 µm below the upper surface U1 and defining a lamina portion A of the silicon wafer, between the cleave plane P and the upper surface U1 and a donor portion D between the cleave plane P and the lower surface L1 of the silicon wafer X1. The lamina portion A is subject to exfoliation from the donor portion D at the cleave plane P, e.g., upon annealing at high temperature, as described below.

In alternative embodiments, the silicon wafer X1 may be implanted with, e.g., helium ions, alone or in addition to hydrogen, and the cleave plane may be from about 0.2 µm to 20 µm, or between 1 µm and 5 µm, below the upper surface U1 of the silicon wafer. The total implanted ion concentration may alternatively be between about $4 \times 10^{16}$ and $2 \times 10^{17}$ ions/cm. Details of creating lamina portions in semiconductor materials by ion implantation and subsequent exfoliation and use in fabrication of a photovoltaic cell are described in co-owned U.S. patent application Ser. No. 12/540,463, Herner, "Intermetal Stack for Use in a Photovoltaic Device" the disclosure of which in its entirety is incorporated herein by reference.

The second bodies X2, referred to herein as a receiver elements, are each square substrate of borosilicate glass, illustratively about 1.1 mm thick and 152 mm on a side. The close match between the thermal expansion properties of borosilicate glass and the wafer material facilitate post-bonding handling of the bonded pair. Alternatively, the receiver element may be of soda lime glass or some other material.

The lower surface L2 of the receiver element X2 or the upper surface U1 of the semiconductor wafer X1 is illustratively covered, e.g., by sputtering, with a conductive and/or reflective metallic material to form a layer M, as shown in FIG. 26. In an alternative approach, material added to both of the upper surface U1 and the lower surface L2 constitutes the layer M. The material in the layer M may be of titanium or aluminum or silicides thereof, or other material. The layer M may be between about 30 Angstrom units and 2,000 Angstrom units thick, for example about 100 to 200 Angstrom units thick. Candidate materials for the semiconductor wafer X1, the receiver element X2, the layer M and its disposition are discussed in are described in U.S. patent application Ser. No. 12/540,463, earlier incorporated by reference, and co-owned U.S. patent application Ser. No. 12/057,265, Herner, "Method to Form a Photovoltaic Cell Comprising a Thin Lamina Bonded to a Discrete Receiver Element," the disclosure of which in its entirety is incorporated herein by reference.

In step 72, the lower 126 and upper susceptors 146 (FIG. 5) in the bonding chamber 20' are heated to a temperature of about 450° C. The bonding chamber 20' is filled with nitrogen gas at approximately atmospheric pressure.

The four sites 28 of the base 25 are loaded with workpieces comprising a wafer X1 and a receiver element X2 in the manner described above for steps 74 and 76. The 180° rotation of the base 25 in step 76 illustratively takes on the order of about 5 to 30 seconds. The bonding chamber 20' is evacuated to about $10^{-4}$ millibar. In step 78, in each of the loading stations 22a and unloading stations 22b, the lower susceptor 126 is raised to lift the wafer X1 off the lower horizontal ledges 135 until the upper surface U1 of the wafer X1 and the lower surface L2 of the receiver element X2 are separated by the predetermined separation Q (FIG. 19). After about 30 seconds of contact between the lower susceptor 126 and the lower surface L1 of the wafer X1, the plunger drive 158 lowers the tip 152 to produce the convexity C, reaching about 0.05 mm downward, in the lower surface L2 of the receiver element X2 in. The convexity C does not span the separation Q (FIG. 20).

The lower susceptor 126 is raised further to lift the wafer X1, which contacts the convexity C and further lifts the receiver element X2 until the wafer and receiver element are held together against the upper susceptor 146 (FIG. 22). As the wafer X1 and receiver element X2 reach thermal equilibrium with the susceptors 126 and 146, the susceptor lift assembly 138 exerts a bonding stress equal to about 5,000 Pa between the lower and upper susceptors 126 and 146. The power apparatus 90 is activated to apply a bias voltage of about 500 V between the lower and upper susceptors 126 and 146 for a predetermined biasing interval of, e.g., about 5 minutes.

In an alternative embodiment, instead of predetermining a biasing interval, the computer system 80 (FIG. 1) may be configured to control the bias voltage in response to a monitored current passing across the contact area R. As bonding progresses, an oxide layer may form at the contact R, causing the current to decrease after attaining a peak value of about 10 to 30 mA and affording a metric by which to evaluate bonding progress.

When bonding is complete the first and second bodies at each of the sites 28 have become a bonded wafer-receiver pair X12 (FIG. 27). After shutting off the bias voltage, the bonded wafer-receiver pair X12 is settled on the support surface 137 as the lower susceptor 126 retreats. Finally, the bonded pair X12 is removed from the bonding chamber 20' in the manner described above for steps 80 and 82. The bonded wafer-receiver pair X12 is suitable for further treatment to render a bonded lamina-receiver assembly useful for photovoltaic device fabrication. Additional processing that may be performed in order to complete fabrication of the photovoltaic device are described in U.S. application Ser. Nos. 12/335,479, 12/057,265, and 12/540,463, earlier incorporated by reference.

In an alternative embodiment of the materials processing system 10 (FIG. 1), the structure 20 is a four-site exfoliation chamber for stimulating exfoliation of laminae from respective workpieces, such as the two-body bonded structures X12 (FIG. 27). Exfoliation of a lamina from the semiconductor wafer X1 in the bonded structure X12 renders a lamina bonded to the substrate X2, constituting a lamina-receiver assembly useful for fabricating a photovoltaic device.

Figure 28:
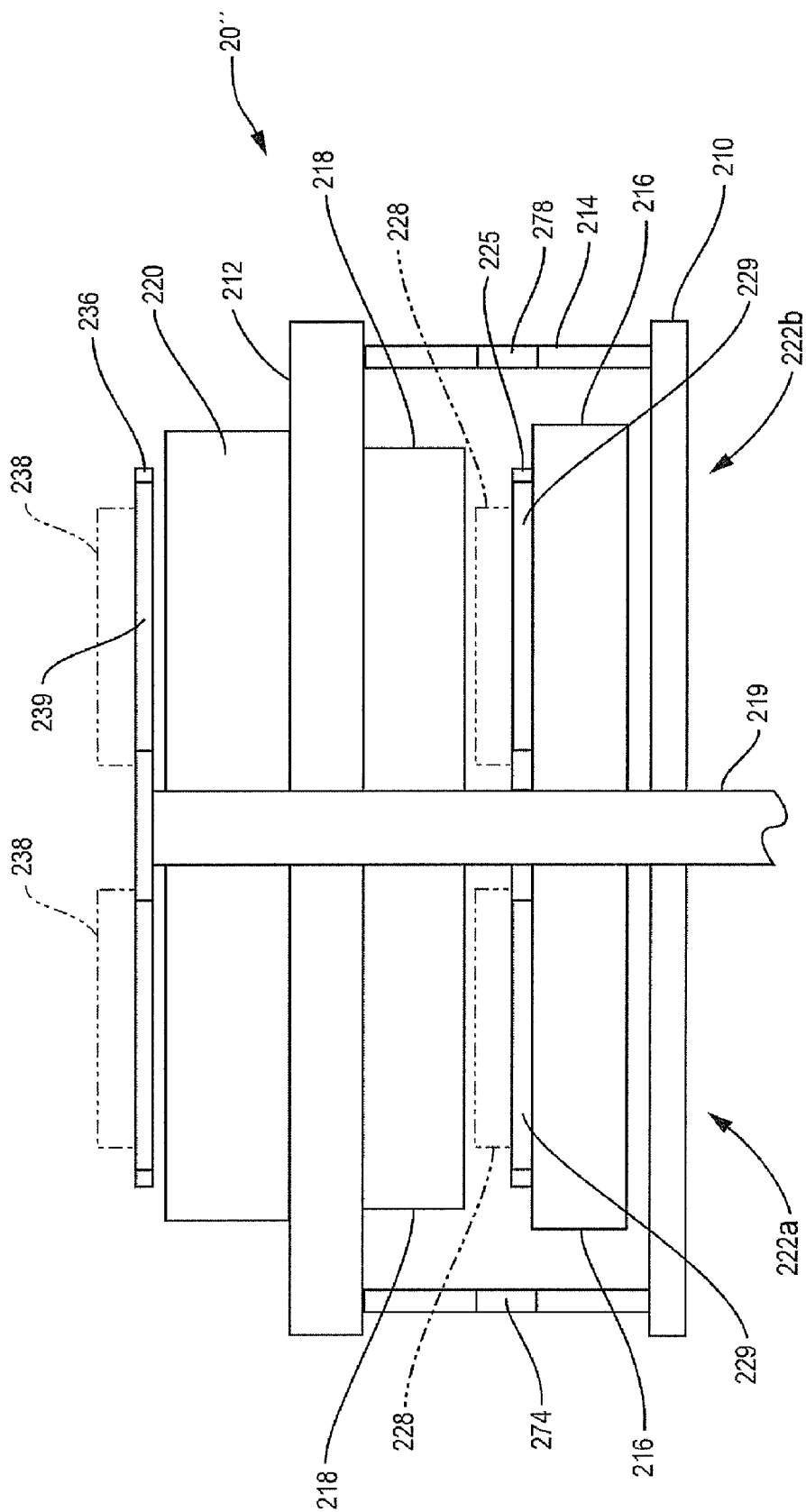
FIG. 28 is a sectional view of a multi-site exfoliation chamber compatible with the invention, taken through the center of the chamber from its input gate to its output gate.

The exfoliation chamber may be of similar construction with the illustrative bonding chamber 20' (FIG. 5). FIG. 28 shows an exemplary exfoliation chamber 20" with active components in respective rest positions. The loading stations 222*a* and the unloading stations 222*b*, accessible through an input gate 274 and an output gate 278, respectively, serve as identical fixed exfoliation stations during operation of the exfoliation chamber 20". Each of the stations 222*a* and 222*b* comprises a lower component assembly 216 and an upper component assembly 218. Lower component assemblies 216, supported by the chamber floor 210 and underlying the base 225, comprise respective lower heaters, lower susceptors and lift assemblies. The chamber floor 210 and chamber lid 212 are apertured to permit function of movable components as discussed above with regard to the bonding chamber 20'.

The base 225, which serves as an exfoliation base, is rotatably supported by the shaft 219, between the lower component assemblies 216 and the upper component assemblies 218. Four identical sites 228 which serve as exfoliation sites during processing are fixed on the base 225. The workpiece supports defining the sites 228 above the base 225 are formed and arranged similarly to the support pins 130*a* and capture pins 130*b* (FIG. 6) of the sites 28 in the bonding chamber 20'. For processing workpieces X12 (FIG. 27) formed by bonding at the sites 28, the sites 228 are illustratively configured identically to the sites 28 and define identical interior spaces 160 and 164 (FIG. 9). In alternative embodiments, the vertical wall 136 of each of the sites 228 may be configured to define a first interior space of greater diameter to facilitate catching a separated donor, as discussed below.

The illustrative exfoliation chamber 20" differs from the described bonding chamber 20' (FIG. 5) in that the stations 222*a* and 222*b* lack the plungers 150, the plunger drives 158, the accommodating apertures in the lid 112, and the gimbal plates 124 of the bonding chamber 20'. The enclosure of the exfoliation chamber 20" may be constituted such that it cannot support a vacuum or exclude the ambient atmosphere. The upper assemblies 218 do not require the same mechanical and surface properties as needed in the upper susceptor 246 of the illustrative bonding chamber 20' since the envisioned exfoliation procedure, discussed below, does not entail contact between the upper assemblies 218 and respective workpieces X12. Accordingly, each upper assembly 218 comprises a quartz emitter embedded with a resistively heated coil to form a radiant heater disposed on the side of the upper assembly 218 closer to the base 225. The upper assembly 218 may comprise thermal insulation on its opposite side, nearer the chamber lid 212. The IR spectrum of the heater in the upper assembly 218 is illustratively particularly tailored to generate a thermal response in the second body X2 of the workpiece X12. The quartz emitter has a relatively low thermal mass and may thus be more quickly responsive to a change in temperature setpoint than is the upper susceptor 146 of the bonding chamber 20".

Furthermore, an insulating platform 220 is disposed on the lid 212 of the exfoliation chamber 20". Above the platform 220 is a rotatable cooling base 236 bearing four cooling sites 238 configured identically to the exfoliation sites 228. Two locations above the unloading stations 222*b* of the exfoliation chamber 20' are transfer locations 239 for placing and removing workpieces on the cooling sites 238. The lid 212 is apertured to accommodate the shaft 219, which supports the cooling base 236. The cooling base 236 is affixed to the shaft 219 so that the cooling sites 238 at all times lie in respective fixed relationships with, illustratively directly above, and move in parallel with respective exfoliation sites 228.

In an alternative approach, exfoliation chamber 20' may be constructed without the cooling base 236, dedicated cooling locations (not shown) being provided elsewhere in the system 10. This approach allows simplification of the exfoliation chamber 20' by obviating the aperture in the chamber lid 212 and the extension of the shaft 219 above the sites 228.

The load robot 30 and the unload robot 40 for loading and unloading the exfoliation chamber 20" may each be equipped with, e.g., a stepped end effector 190 (FIG. 14) or a single-grip end effector 198 (FIG. 15). Illustratively, the load robot 30 wields a single-grip end effector 198. The stepped end effector 190 may be particularly suited to the function of the unload robot 40 in the case that separation of the exfoliated lamina occurs before or during unloading from the exfoliation chamber 20", as discussed below.

Fitted with the exfoliation chamber 20", the materials processing system 10 is operable to simultaneously treat a plurality of multi-body workpieces to exfoliate respective lamina. Illustratively, each of the workpieces is the silicon-glass bonded structure X12 (FIG. 27), implanted to define a cleave plane at 3.0 μm depth in the semiconductor wafer X1, produced in the bonding chamber 20' as described above. Returning to FIG. 2, in an exemplary process sequence for exfoliating a lamina, the workpieces are prepared for exfoliation (step 70) in a bonding apparatus such as a single-site bonder or the illustrative multi-site bonding chamber 20'.

The computer system 80 (FIG. 1) is operated to prepare the system 10 comprising the exfoliation chamber 20" for use (step 72) generally as described above for the analogous bonding chamber 20' (FIG. 5). The lower heaters and the upper heaters in the exfoliation chamber 20" may heat their respective susceptors to an exfoliation temperature of, for example, between 400° C. and 800° C., illustratively between 450° C. and 550° C. By contrast to the bonding procedure described above, the exfoliation chamber 20" may not be evacuated during the exfoliation procedure, the exfoliation chamber 20" instead being, e.g., left open to the ambient atmosphere or filled with an inert environment.

The prepared bonded structure X12 is arranged on the lower contact surface 192 of the single-grip end effector 198 (FIG. 15) wielded by the load robot 30 (FIG. 1). The lower surface L1 (FIG. 27) of the structure X12 is held flush on the blade by vacuum pulled through the vacuum channels 196. The unbonded portion of the lower surface L2 is free for engagement with the support surface 137, configured as shown in FIG. 6 for the sites 28, at the exfoliation sites 228 in the exfoliation chamber 20" (FIG. 28).

Figure 29:
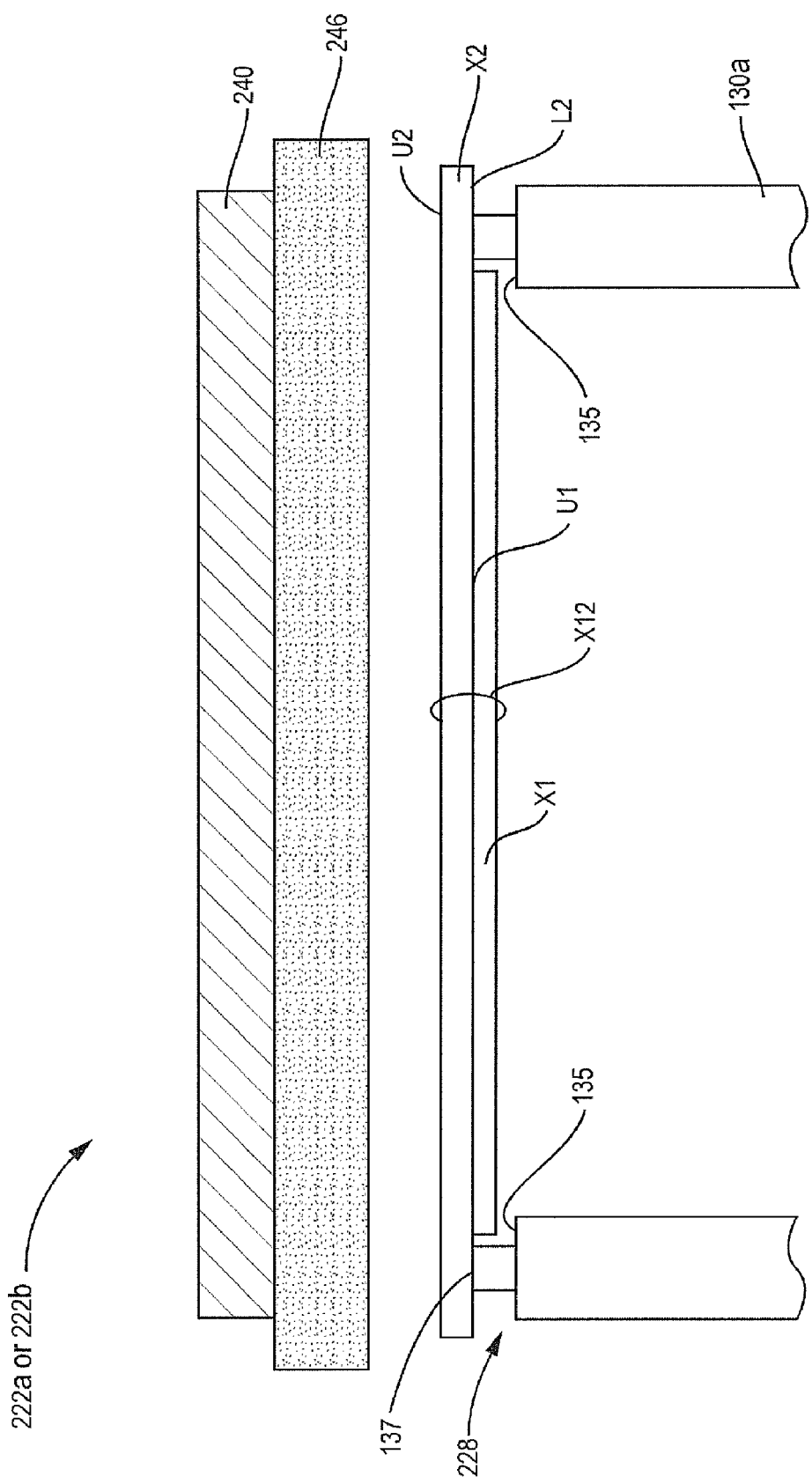
FIG. 29 is a sectional view of a station in the exfoliation chamber, shown in FIG. 28, and an aligned loaded site.

With reference to FIGS. 6, in step 74, a workpiece is loaded onto a site 228 by moving the end effector 198 of the load robot 30 through the input gate 274 and positioning it over the workpiece supports in each of the loading stations 222a. The vacuum holding the workpiece on the end effector 198 is released. For each loading station 222a, the end effector 198 is lowered to settle the bonded structure X12 in on the upper support surface 137 and within the capture surfaces 139, on an aligned site 228. The end effector 198 retracted from the exfoliation chamber 20". The resulting placement of the bonded structure X12 is as shown in FIG. 29, with the workpiece X12 spaced apart from the upper susceptor 246. Coordination of the movement of the exfoliation base 225 with workpiece loading onto sites 228 aligned with loading stations 222a for process steps 74 and 76 proceeds as described above, with reference to FIGS. 16 through 18, for bonding treatment in the bonding chamber 20'.

Figure 30:
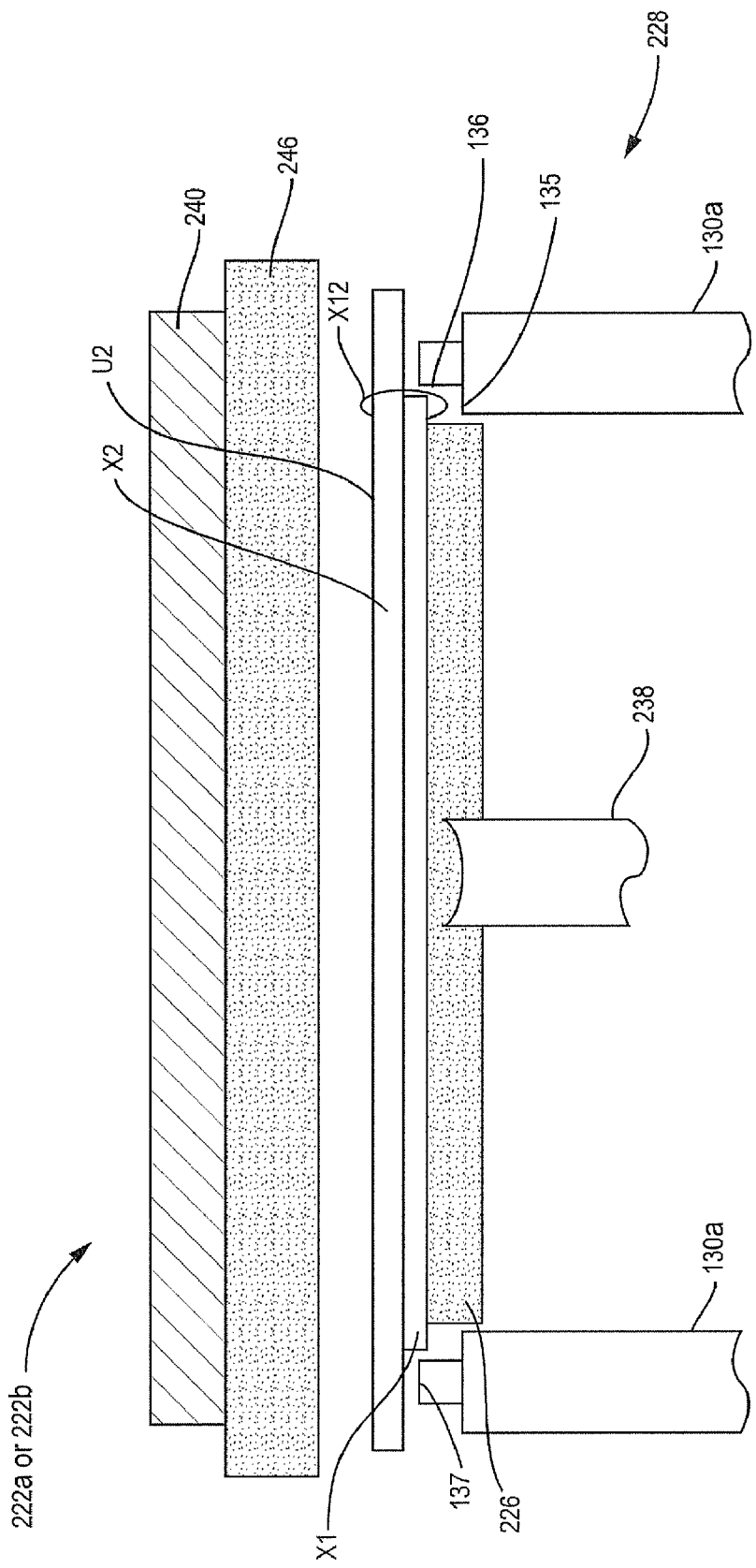
FIG. 30 is a sectional view of the station shown in FIG. 29 with the lower susceptor raised to lift a workpiece off the support pins.

After closing the input gate 274 and allowing time for thermal equilibration in the exfoliation chamber 20", the exfoliation base 225 remains at rest while all of the exfoliation stations 222a and 222b are operated simultaneously to treat the workpieces (step 78). Accordingly, as shown in FIG. 30 for a station 222a or 222b, the susceptor lift assemblies 238 are activated to raise the respective lower susceptors 226 toward the respective lower surfaces L1 of the workpieces X12 on an aligned site 228. To stimulate exfoliation, the lift assemblies 238 continue upward until the respective lower susceptors 226 have lifted the respective bonded structures X12 from the support surface 137 and approached the upper surfaces U2 of the bonded structures X12 toward the upper susceptors 246. At each site 228, the conductive heat transfer from the lower susceptor 226 and the radiative heat transfer from the upper susceptor 246 provokes aggregation of the atoms implanted in the semiconductor wafer X1 (FIG. 27) into a gas phase causing fracture at the cleave plane P. The bonded structures X12 may be held on the respective lower susceptors 226 below the respective upper susceptors 246 for a predetermined processing period on the order of, e.g., one minute, three minutes, five minutes, ten minutes, or longer to complete exfoliation. In the embodiment, the lamina portion A bonded to the receiver element X2 is 3 μm thick.

Figure 31:
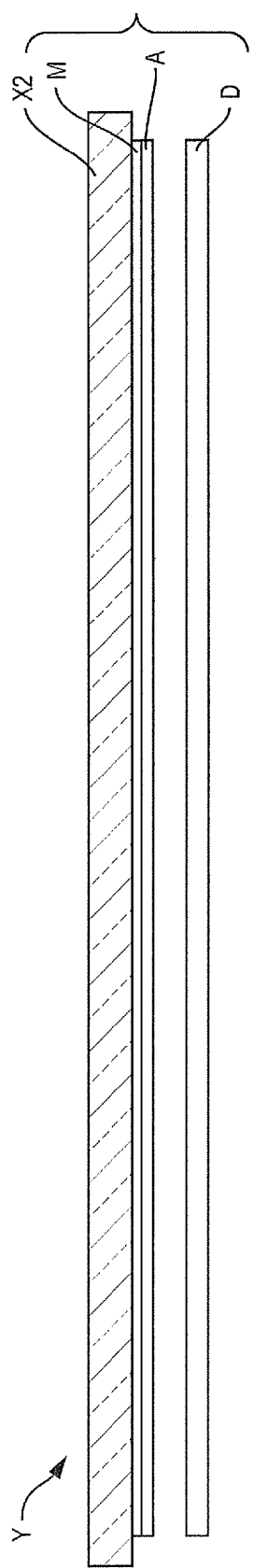
FIG. 31 is a sectional view of the bonded structure shown in FIG. 27 with the donor separated.

After the processing period has passed, the lower susceptors 226 are lowered to their respective rest positions under the base 225, depositing the workpieces on the support surface 137, as illustrated in FIG. 6 for the sites 28 in the bonding chamber 20', of the support pins 130a on the way. In some instances, the bonded structure X12 (FIG. 27) remains intact, with the donor D unseparated from the exfoliated lamina A after exfoliation processing is complete in the exfoliation chamber 20". In this case, at the end of step 78, the bonded structure X12 is situated on the site 228 as shown in FIG. 29. With reference to FIG. 31, in other instances, the donor portion D of the semiconductor wafer X1 separates from the exfoliated lamina A at the cleave plane P, thereby rendering a bonded lamina-receiver assembly Y. In this case, the separated donor D is caught by the lower shelf of the site 228.

The output gate 278 (FIG. 28) is opened to allow access to the unloading stations 222b by the unload robot 40 (FIG. 1). In step 80, for each unloading station 222b, the unload robot 40 is operated to advance its stepped end effector 190 into the space above the base 225 and below the aligned first interior space 160, configured as illustrated for the sites 28 in FIG. 9, of the aligned site 228. With the edges 193 and 195 (FIG. 14) of the end effector 190 positioned to complement the lower vertical wall 136 and the capture surfaces 139, arranged as illustrated in FIG. 6, respectively, of the site 228, the end effector 190 is raised. The unbonded portion of the lower surface L2 of the glass substrate X2 comes to rest on the upper contact surface 194 (FIG. 14) of the end effector 190. If separated, the donor portion D comes to rest on the lower contact surface 192. Vacuum is pulled through the vacuum channels 196 to secure the processed workpiece, and the end effector 190 is retracted through the output gate 278, removing the workpiece from the exfoliation chamber 20".

The unload robot 40 (FIG. 1) is illustratively operated to transfer the unloaded processed workpieces directly onto respective cooling sites 238 aligned with respective transfer locations 239 located directly above the unloading stations 222b from which the respective workpieces were removed. The processed workpiece is deposited onto the cooling site 236 in the fashion described above for loading the first body X1 and the second body X2 onto a site 28 in the bonding chamber 20', with reference to step 74 of the bonding treatment sequence. Alternatively, the unload robot 40 may be operated to transfer the unloaded workpieces to other dedicated cooling locations as discussed above.

Coordination of the movement of the exfoliation base 225 with workpiece unloading from sites 228 aligned with unloading stations 222b for process steps 80 and 82 proceeds as described above, with reference to FIGS. 24 and 25, for unloading after treatment in the bonding chamber 20'. The rotation of the exfoliation base 225 to align sites 228 with respective unloading stations 222b in step 82 also aligns cooling sites 238 with respective transfer stations 239 of the cooling base 236 for receiving processed workpieces.

During cooling on the sites 238 or elsewhere, the lamina-receiver assemblies Y come to ambient temperature. Donors D (FIG. 31) that did not separate in the chamber 20" during exfoliation may separate during cooling. The lower steps 135 of the support pins 130a, configured as shown in FIG. 6 for sites 28, of the cooling sites 238 are positioned to catch the respective separated donors D. The separated lamina-receiver assemblies Y are suitable for fabrication of a photovoltaic device.

Figure 32:
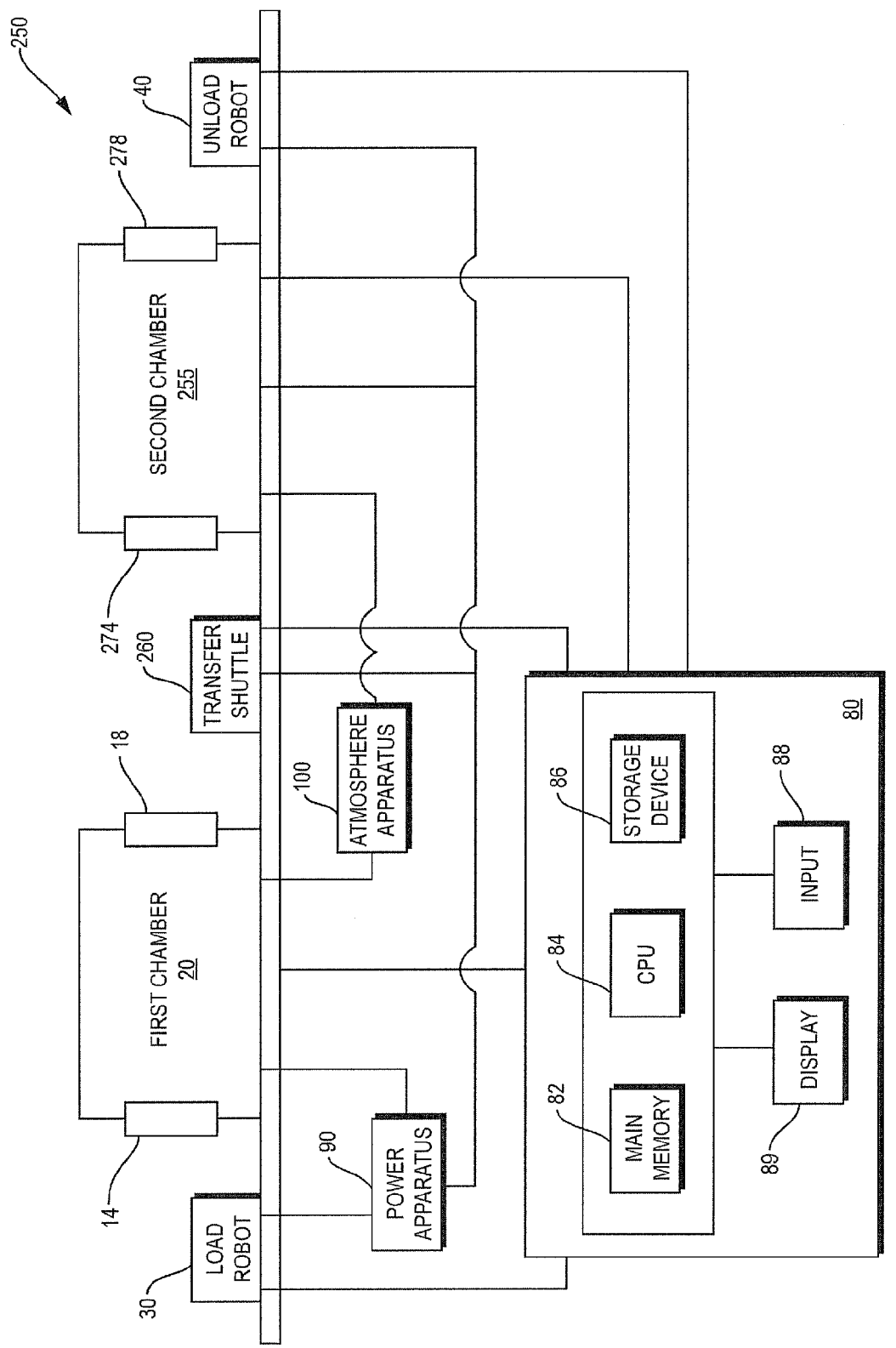
FIG. 32 is a block diagram of multi-stage system, compatible with the invention, for subjecting a workpiece batch to sequential procedures.

Consecutive multi-site materials processing structures may be used cooperatively to act on a batch of workpieces through sequential procedures economically and efficiently. With reference to FIG. 32, an illustrative multi-stage system 250 for subjecting a workpiece batch to sequential procedures comprises a load robot 30 and a first structure 20, as described above with reference to FIG. 1. Unloading stations in the first structure 20 are accessible through its output gate 18 by a transfer shuttle 260. The system 250 further comprises a second structure 255 configured similarly to the first structure 20, with loading stations accessible by the transfer shuttle 260 through an input gate 274 and unloading stations by an unload robot 40 through an output gate 278. The system 250 may be located in a clean area supplied with HEPA-filtered air to minimize contamination of workpieces outside the first and second structures 20 and 255.

The computer system 80, the power apparatus 90 and the atmosphere apparatus 100 are as described above with reference to FIG. 1 and are furthermore similarly operatively coupled to the transfer shuttle 260 and components of the second structure 255.

The first structure 20 and the second structure 255 are operable simultaneously, each structure at a, in general, different step in the sequence shown in FIG. 2, to execute consecutive operations on serial batches. After a start-up transient, the removal of treated workpieces (step 80) from the first structure 20 is coordinated with the loading of workpieces (step 74) into the second structure 255.

Figure 33:
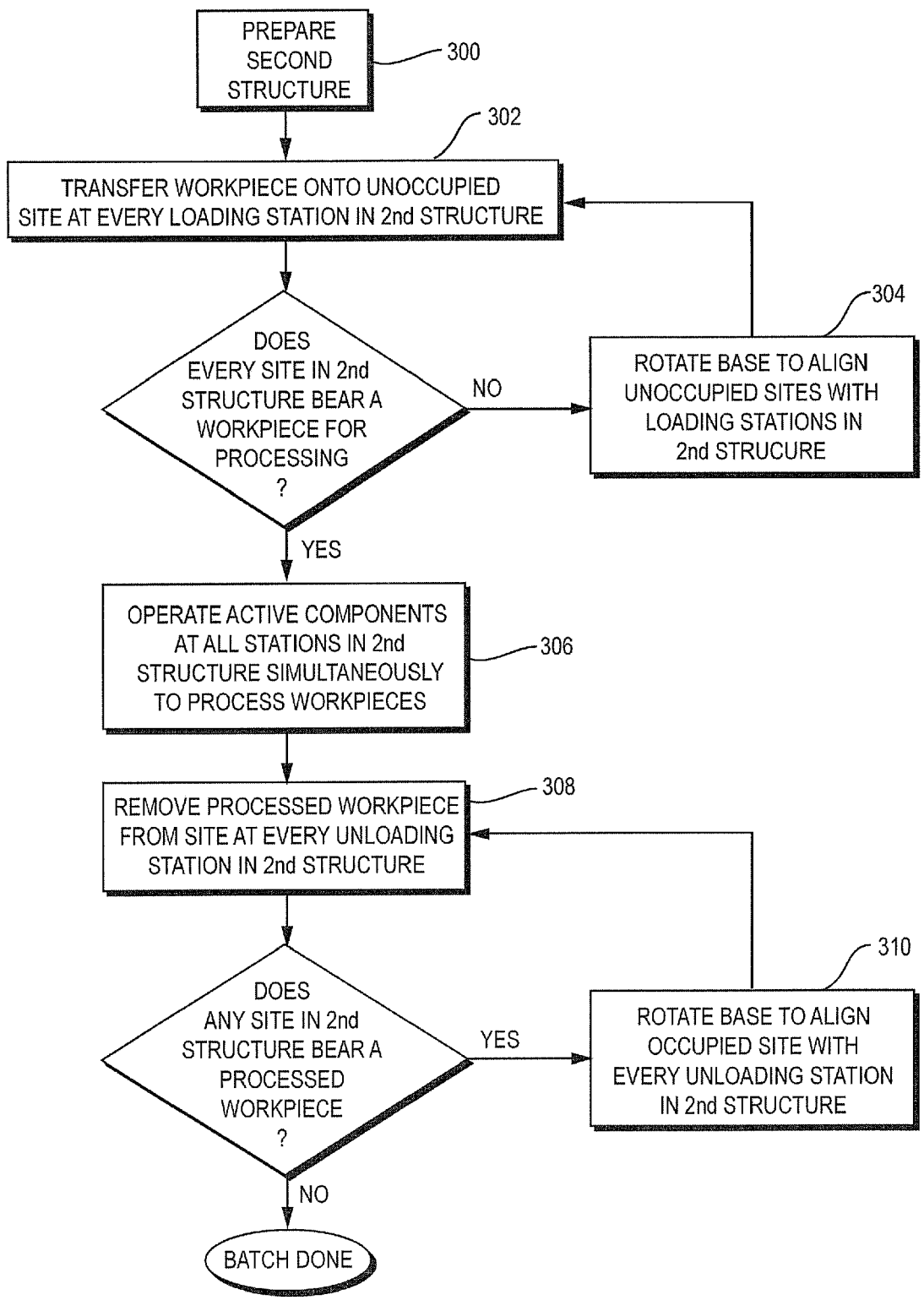
FIG. 33 is a flow diagram of an illustrative sequence, compatible with the invention, for processing multiple workpieces simultaneously.

To facilitate discussion of the cooperative operation of the first structure 20 and the second structure 255, FIG. 33 shows the steps of an illustrative sequence of steps, corresponding to steps 72 to 82 of FIG. 2, for processing a batch of workpieces, transferred from the first structure 20, in the second structure 255. Workpiece preparation for the processing carried out in the second structure 255 occurs in the first structure 20' during steps 70 and step 78.

The coordination between the first structure 20 and the second structure 255 may be understood with reference to the bonding chamber 20' (FIG. 5) as the first structure 20, operating according to the sequence shown in FIG. 2, and the exfoliation chamber 20" (FIG. 28) as the second structure 255, operating according to the sequence shown in FIG. 33. The bonding chamber 20' treats serial batches of two-body workpieces to form bonded structures. The bonded structures prepared in the bonding chamber 20' constitute workpieces for subsequent processing in the exfoliation chamber 20", which renders lamina-receiver assemblies.

Figure 34:
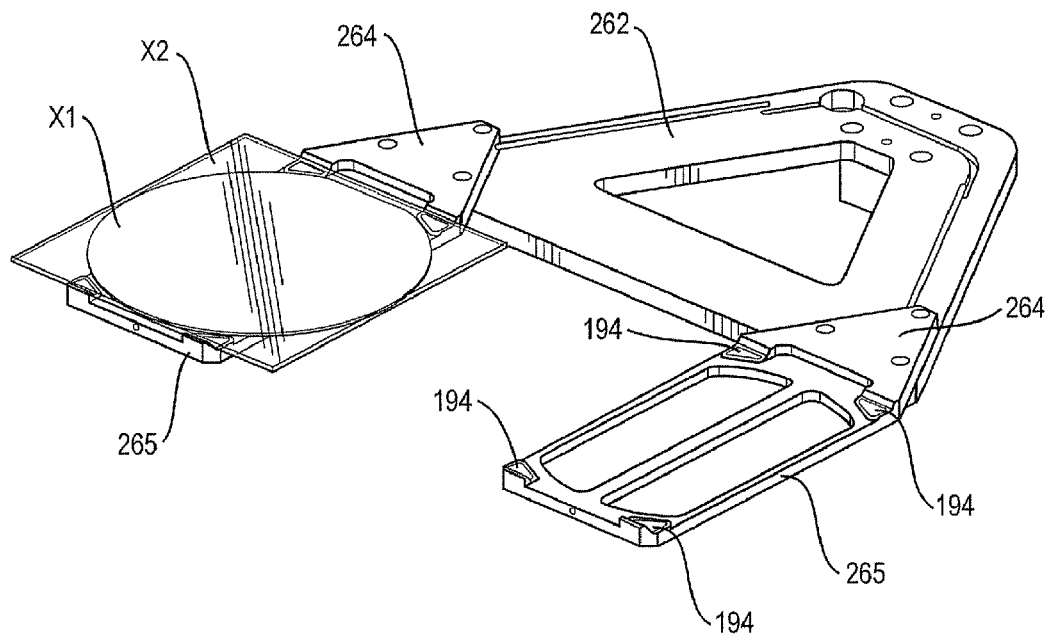
FIG. 34 is a perspective view of a shuttle implement having joined blades each bearing an end effector.

An illustrative embodiment of the transfer shuttle 260 suitable for transferring bonded structures from the bonding chamber 20' (FIG. 5) to the exfoliation chamber 20" (FIG. 28) comprises an implement 262 bearing two blades 264, as shown in FIG. 34, each ending in a receiver-gripping end effector 265. Each end effector 265 is illustratively configured with an upper contact surface 194 and vacuum channels, as described above for the stepped end effector 190 with reference to FIG. 14. The end effector 265 is suited to hold a bonded workpiece by an unbonded portion of the lower surface L2 (FIG. 11) of the second body X2. The transfer shuttle 260 equipped with the receiver-gripping end effector is operable to remove a bonded workpiece from a site 28 (FIG. 5) as described above for the unload robot 40 wielding the stepped end effector 190 (FIG. 14) and to load the removed workpiece onto a site 228 (FIG. 28) as described above for the load robot 30. Auxiliary mechanisms (not shown) supporting the two-blade implement 262 are configured to allow the end effectors 265 to, e.g., move along an axis between the respective centers of the first chamber 20 (bonding chamber 20') and the second chamber 255 (exfoliation chamber 20"); be oriented alternately toward the output gate 18 or toward the input gate 274; and to rise or descend with respect to the sites 28 or 228. Robotic components providing the requisite degrees of motion to the implement 262 on the transfer shuttle 260 are known to those skilled in the art. Alternatively, with reference to FIG. 35, each blade 264 of the implement 262 may bear a small end effector 268, illustratively of stainless steel or quartz. The top of the small end effector 268 is contoured with three circular bosses 269 raised about 0.5 mm above the surrounding surface. Vacuum ports 270 are configured to allow the lower surface L1 (FIG. 11) of a workpiece to be pulled against the bosses 269 after workpieces are lifted from the sites 28 (FIG. 5). For workpieces incorporating a 150-mm wafer, the small end effector 268 may be about 50 mm in diameter. The end effector 268 is suited to hold a bonded workpiece by the lower surface L1 (FIG. 11) of the first body X1. The transfer shuttle 260 equipped with the small end effectors 268 is operable to remove a bonded workpiece from a site 28 (FIG. 5) as described above for the unload robot 40 wielding the single-grip end effector 198 (FIG. 15). The small end effector 268 grips the first body X1 of the bonded workpiece with less contact to the lower surface L1 than the single-grip end effector 198 described above with reference to FIG. 15.

The transfer shuttle 260 is operable to retrieve and deliver two workpieces in parallel, for enhanced throughput of the system 250. Illustratively, the bonding chamber 20', the exfoliation chamber 20" and the transfer shuttle 260 are configured so that the parallel transfer of two bonded structures from the unloading stations 22b to the loading stations 222a can be accomplished in less than 15 seconds, 10 seconds or 5 seconds from the time the end effectors 198 enter the output gate 18 to the time the end effectors have cleared the input gate 274. To minimize the process time needed in the exfoliation chamber 20", it may also be desirable to transfer the workpieces from the bonding chamber 20" before their respective temperatures decrease from the bonding temperature by more than 100° C., 50° C., 20° C. or 10° C. Avoiding a large temperature decrease during transport may be more critical for soda lime glass receivers due to their relatively large coefficients of thermal expansion compared to borosilicate glass.

In one embodiment, the transfer shuttle 260 is operable to pivot the implement 262 alternatively to face the bonding chamber 20' and the exfoliation chamber 20" at a position nominally halfway between the two chambers 20' and 20". The transfer shuttle 260 is furthermore operable to place the implement 262 at a single operating location, along the axis between the bonding chamber 20' and the exfoliation chamber 20", within each of the bonding chamber 20' and the exfoliation chamber 20". Illustratively, the supporting auxiliary mechanism of the transfer shuttle 260 is at a fixed location, between the two chambers 20' and 20", that optimizes either the spatial relationship between the implement 262 and the bonding sites 28 (FIG. 5) aligned with the unloading stations 22b in the bonding chamber 20' or the spatial relationship between the implement 262 and the exfoliation sites 228 (FIG. 27) aligned with loading stations 222b in the exfoliation chamber 20". The sites 28 or 228 of the other chamber 20' or 20", respectively, may then be adjusted, before being fixed on the base 25 or 225, respectively, preparatory to operation of the respective chamber, to optimize the relationship between the end effectors 265 (FIG. 34) or 268 (FIG. 35) and the sites 28 or 228.

Figure 36:
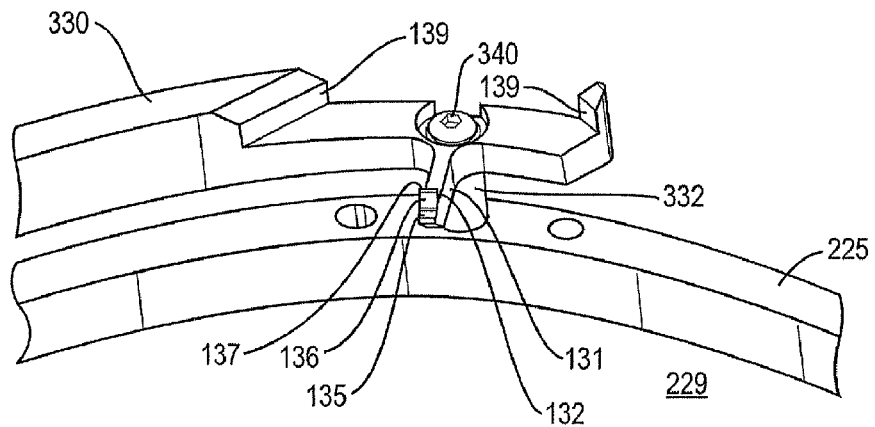
FIG. 36 is a perspective view of a position-adjustable workpiece support.
Figure 37:
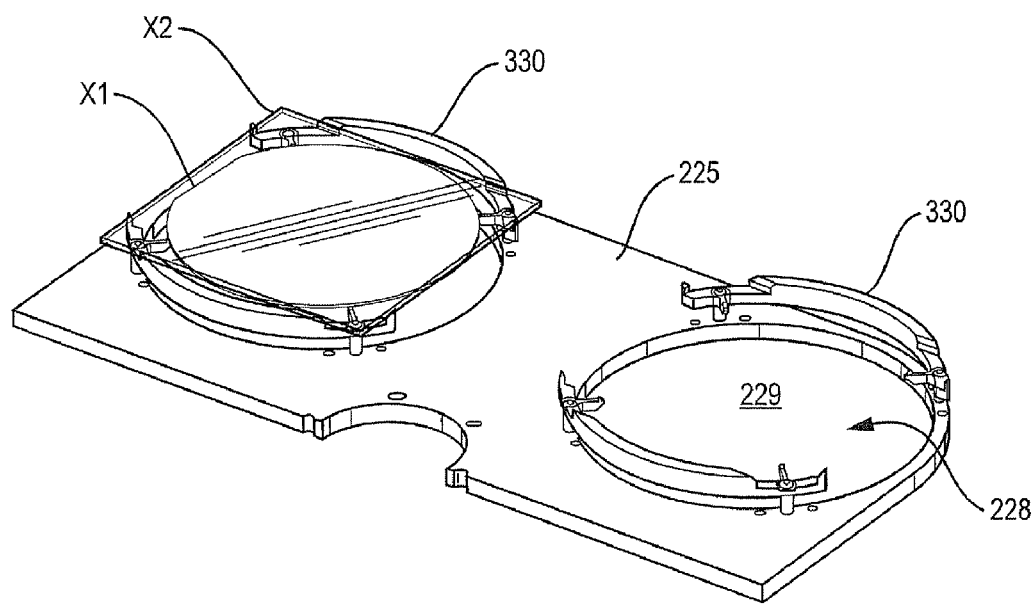
FIG. 37 is a perspective view of a base having sites defined by position-adjustable workpiece supports.

With reference to FIGS. 36 and 37, in an alternative embodiment, the exfoliation sites 228 in the exfoliation chamber 20" (FIG. 28) may comprise workpiece supports 330 that are adjustable in position to allow fine tuning of their respective positions by, e.g., up to about 1 mm. A projection 131 extends from the illustrative arcuate position-adjustable workpiece support 330 extends over the aperture 229 and terminates in a level sill serving as horizontal ledge 135. A tine 132 extending upward from the projection 131 provides a vertical wall 136 and horizontal support surface 137. At each end of the support 330, a pair of vertical capturing surfaces 139 are contoured to hold a corner of a square second body X2. The horizontal ledges 135, vertical walls 136, horizontal support surface 137 and vertical capture surfaces 139 of the position-adjustable workpiece support 130 function to confine the round first body X1 and the square second body X2 of a workpiece as described above for the support pins 130a and the capture pins 130b.

The sites 228 may each have two arcuate workpiece supports 330 disposed around its aperture 29 in a minor-image relationship. Illustratively, each position-adjustable workpiece support 330 has a post 332 at each end at which the support 330 is joined to the base 225. The posts 332 are drilled to house a screw 340 which has a distal end that may be turned to seat in a tapped hole in the base 225 (not shown). The inner diameter of the post 332 is sufficiently large to allow fine adjustment of the position of the support 330 on the base 225 when the screws 340 are loosened. Similar adjustment of both supports 330 at a given site 228 allows the site to be translated closer to or further from the input gate 274 and the transfer shuttle 260 before loading.

The ability to adjust the position of each site 228 with respect to the transfer shuttle 260 before fixing the sites 228 on the base 225 allows for optimization of the spatial relationship, in the exfoliation chamber 20", between the sites 228 and respective end effectors 265 (FIG. 34) or 268 (FIG. 35) of the transfer shuttle 260 (FIG. 32) in its operating location. Equivalently, the bonding sites 28 (FIG. 5) in the bonding chamber 20' may be defined by position-adjustable workpiece supports 330 for fine-tuning the respective positions of the bonding sites 28 while the exfoliation sites 228 are defined by nonadjustable workpiece supports 130 in an optimized spatial relationship with respective end effectors 265 or 268.

For the sake of illustration, with continuing reference to FIGS. 2, 5, 28 and 33, consider a first batch of workpieces treated earlier in the bonding chamber 20' and then processed in the exfoliation chamber 20" while a second batch is begun in the bonding chamber 20'. Immediately after step 78, the sites 28 of the bonding chamber 20' are supporting four bonded structures X12 (FIG. 27) constituting the second, treated batch. Immediately after step 306, the sites 228 of the exfoliation chamber 20" are supporting four lamina-receiver assemblies Y (FIG. 31), constituting the first, processed batch. Continuing with the exfoliation chamber 20", step 308 leaves the exfoliation sites 228 that are aligned with the unloading stations 222b unoccupied. Rotating the base 225 to align exfoliation sites 228 that are occupied by workpieces of the first batch with the unloading stations 222b (step 310) also brings exfoliation sites 228 that are unoccupied in alignment with the loading stations 222a (step 304).

Further concurrent progress of the sequences associated with the bonding chamber 20' and the exfoliation chamber 20" may coordinate the loading loop of steps 302 and 304 with the unloading loop of steps 80 and 82. Transferring bonded structures from bonding sites 28 aligned with the unloading stations 22b of the bonding chamber 20' onto exfoliation sites 228 aligned with loading stations 222a of the exfoliation chamber 20" accomplishes both step 80 and step 302, respectively, so that they may be considered merged. Next, both the base 25 and the base 225 are rotated, completing steps 82 and 304, respectively. Merged steps 80 and 302 are then repeated. At this point, unloading of the first batch from the exfoliation chamber 20" and the loading of the second batch into the exfoliation chamber 20" has been completed. The exfoliation sites 228 bear bonded structures of the second batch for processing and is ready for initiation of step 306 for the second batch.

During the repetition of steps 80 and 302, a pair of untreated two-body workpieces of a third batch may be loaded onto the loading stations 22a, accomplishing a first iteration of step 74 for the third batch. After the loading loop (steps 76 and 74) for the bonding chamber 20' is complete, the treatment sites 28 bear a third batch of two-body workpieces for treatment.

Operation of the bonding chamber 20' (step 78) and of the exfoliation chamber 20" (step 306) may be coordinated to occur simultaneously. Alternatively, operation of the exfoliation chamber 20" may begin as soon as all of the exfoliation sites 228 are loaded, with the sequence of steps 76 and 74 taking place after operation of the exfoliation chamber 20" (step 306) has begun. For steps involving only one of the bonding chamber 20' and the exfoliation chamber 20", synchronization between the respective sequences may be chosen with consideration of the relative lengths of time necessary to accomplish the respective loading, transfer, unloading and operating steps so as to optimize throughput of the system 250.

The enhanced throughput and relative low cost of the component multi-site chambers 20' and 20" may be enhanced by their incorporation in a single system 250 (FIG. 32) to provide economical lamina-receiver assemblies for solar energy applications.

Although specific features of the invention are included in some embodiments and not in others, it should be noted that individual feature may be combinable with any or all of the other features in accordance with the invention. Furthermore, other embodiments are compatible with the described features. For example, the upper susceptor 146 or 246 may be configured to descend toward the upper surface U2 of the second body X2.

It will therefore be seen that the foregoing represents a highly advantageous approach to treating multi-workpiece bathes, particularly for bonding and exfoliation to produce lamina-receiver assemblies for photovoltaic devices. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A system for treating a plurality of workpieces, each workpiece comprising a first body having a thickness and a lateral area and a second body having a lateral area larger than the lateral area of the first body, the system comprising:
    four substantially identical stations, comprising a pair of loading stations and a pair of unloading stations, distinct from the loading stations, and each configured with an upper heat-transfer body and a lower heat-transfer body;
    a base, disposed between the lower heat-transfer bodies and the upper heat-transfer bodies;
    two nonoverlapping pairs of substantially identical sites on the base, arranged analogously to the stations, each site comprising a shelf having a horizontal ledge and a vertical wall, accommodating an interior space above the base, and configured to bear one of the workpieces, wherein
    the base is rotatable about an axis to align each of the pairs of sites in turn with the loading stations and the unloading stations, and
    the stations are operable simultaneously to lift respective lower heat-transfer bodies into respective interior spaces of respective aligned sites while heating the lower and upper heat-transfer bodies.

2. The system of claim 1 wherein
the shelf at each site is a lower shelf,
the interior space at each site is a first interior space corresponding in lateral extent to the first body, each of the sites further comprises an upper shelf, having a vertical wall and a horizontal ledge, accommodating a second interior space corresponding in lateral extent to the second body, and the respective horizontal ledges of the upper and lower shelves at each site are separated vertically by a distance greater than the thickness of the first body.

3. The system of claim 2 wherein the stations are operable to press respective workpieces loaded onto respective aligned sites between respective lower heat-transfer bodies and respective upper heat-transfer bodies while heating the respective lower and upper heat-transfer bodies, thereby effecting a bond between respective first bodies and respective second bodies.

4. A system for treating a plurality of workpieces, the system comprising:

a plurality of substantially identical stations, comprising a pair of loading stations and a pair of unloading stations distinct from the loading stations, each station being configured with an upper heat-transfer body and a lower heat-transfer body, the lower heat-transfer bodies being operable simultaneously to rise toward respective upper heat-transfer bodies;

a base, disposed between the lower heat-transfer bodies and the upper heat-transfer bodies;

a plurality of nonoverlapping pairs of substantially identical sites on the base, arranged analogously to the stations, each site comprising a shelf, having a horizontal ledge and a vertical wall, accommodating an interior space above the base, and configured to bear one of the workpieces; and an enclosure, housing the stations, base and sites, having an input gate through which the loading stations are accessible and an output gate, distinct from the input gate, through which the unloading stations are accessible, wherein the base is rotatable about an axis to align each of the pairs of sites in turn with the loading stations and the unloading stations and the enclosure, base, stations and sites, belonging to a first chamber.

5. The system of claim 4 wherein in the stations the respective lower heat-transfer bodies are operable to rise into the respective first interior spaces of respective aligned sites.

6. The system of claim 5 wherein the stations are operable to press respective workpieces loaded onto respective aligned sites between respective lower and upper heat-transfer bodies.

7. The system of claim 5 wherein each of the workpieces comprises a first body having a thickness and a lateral area and a second body having a lateral area larger than the lateral area of the first body, the shelf at each site is a lower shelf, the interior space at each site is a first interior space corresponding in lateral extent to the first body, each of the sites further comprises an upper shelf, having a vertical wall and a horizontal ledge, accommodating a second interior space corresponding in lateral extent to the second body, and the respective horizontal ledges of the upper and lower shelves at each site are separated vertically by a distance greater than the thickness of the first body.

8. The system of claim 7 wherein the lateral area of the first body corresponds to a standard semiconductor wafer and the thickness is less than 1 mm.

9. The system of claim 7 wherein the lateral area of the first body and the lateral area of the second body are different in shape.

10. The system of claim 4 wherein the sites are four in number.

11. The system of claim 4 further comprising a loading device configured to load one of the workpieces onto each of two sites, aligned with respective loading stations, simultaneously.

12. The system of claim 4 wherein each of the workpieces comprises a first and second body and the stations are operable simultaneously to cause respective first bodies and respective second bodies loaded onto respective aligned sites to bond together.

13. The system of claim 4 wherein the stations are operable simultaneously to cause respective laminae to exfoliate from respective workpieces, implanted with atoms defining respective cleave planes, loaded onto respective aligned sites.

14. A system for treating a plurality of workpieces, the system comprising:

a plurality of substantially identical treatment stations, comprising one or more loading stations and one or more unloading stations, wherein the loading and unloading stations are mutually distinct and each of the treatment stations is configured with a lower component;

a base, disposed above the lower components; and a plurality of substantially identical treatment sites on the base, arranged analogously to the treatment stations, each treatment site comprising a shelf, having a horizontal ledge and a vertical wall, accommodating an interior space above the base, configured to bear one of the workpieces, wherein the base is rotatable about an axis to align each of the treatment sites in turn with respective treatment stations for loading and unloading, in the treatment stations the respective lower components are operable to rise into the respective interior spaces of respective aligned treatment sites, and the treatment stations, treatment base and treatment sites constitute a first chamber.

15. The system of claim 14 wherein each workpiece comprises a first body and a second body and the treatment stations are operable simultaneously to cause respective first bodies and respective second bodies on respective aligned treatment sites to bond together.

16. The system of claim 14 wherein the treatment stations are operable simultaneously to cause respective laminae to exfoliate from respective workpieces, implanted with atoms defining respective cleave planes, on respective aligned treatment sites.

17. The system of claim 14 wherein in the treatment stations the respective lower components are operable to heat respective workpieces on respective aligned treatment sites.

18. The system of claim 14 wherein each of the treatment stations is configured further with an upper component disposed above the base and the stations are operable to press respective workpieces loaded onto respective aligned treatment sites between respective lower components and respective upper components.

19. The system of claim 18 wherein the treatment stations are operable to apply a voltage between respective lower components and respective upper components.

20. The system of claim 14 wherein the first chamber comprises an enclosure having an input gate and an output gate distinct from the input gate.

21. The system of claim 20 wherein the enclosure further comprises a lid, the system further comprising:
- a cooling base, disposed on the lid;
- one or more transfer stations each situated above one of the unloading stations; and
- a plurality of cooling sites, each configured to bear one of the workpieces on the cooling base, arranged analogously to the treatment sites, wherein the cooling base is rotatable about the axis to align each of the cooling sites in turn for workpiece transfer and coupled to the treatment base so that the cooling sites at all times lie in fixed relationships with and move in parallel with respective treatment sites.

22. The system of claim 14 further comprising:
- a second chamber configured with
  - a plurality of process stations, comprising one or more loading stations and one or more unloading stations, wherein the loading and unloading stations of the second chamber are mutually distinct and each of the process stations is configured with an active component movable within its process station;
- a process base; and
- a plurality of process sites, each configured to bear one of the workpieces on the process base, arranged analogously to the process stations, wherein the process base is rotatable about an axis to align each of the process sites in turn with respective process stations for loading and unloading.

* * * * *